(12) United States Patent
Choi

(10) Patent No.: US 9,837,389 B2
(45) Date of Patent: Dec. 5, 2017

(54) DISPLAY DEVICE USING SEMICONDUCTOR LIGHT EMITTING DEVICE AND METHOD FOR MANUFACTURING THE SAME

(71) Applicant: LG ELECTRONICS INC., Seoul (KR)

(72) Inventor: Hwanjoon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/140,306

(22) Filed: Apr. 27, 2016

(65) Prior Publication Data

US 2017/0012026 A1   Jan. 12, 2017

(30) Foreign Application Priority Data

Jul. 6, 2015 (KR) .................. 10-2015-0095987

(51) Int. Cl.

| H01L 33/62 | (2010.01) |
|---|---|
| H01L 25/075 | (2006.01) |
| H01L 23/538 | (2006.01) |
| H01L 33/60 | (2010.01) |

(Continued)

(52) U.S. Cl.
CPC ...... *H01L 25/0753* (2013.01); *H01L 23/5386* (2013.01); *H01L 33/32* (2013.01); *H01L 33/60* (2013.01); *H01L 33/62* (2013.01); *H01L 33/505* (2013.01); *H01L 2933/0066* (2013.01)

(58) Field of Classification Search
CPC ............ H01L 23/5386; H01L 25/0753; H01L 2933/0041; H01L 2933/0058; H01L 2933/0066; H01L 33/505; H01L 33/60; H01L 33/62

See application file for complete search history.

(56) References Cited

U.S. PATENT DOCUMENTS

| 5,153,709 A | * | 10/1992 | Fukuoka | ............... H01L 23/057 |
|---|---|---|---|---|
| | | | | 257/704 |
| 5,529,634 A | * | 6/1996 | Miyata | .................... C23C 14/04 |
| | | | | 118/300 |

(Continued)

FOREIGN PATENT DOCUMENTS

| KR | 10-2015-0031991 A | 3/2015 | |
|---|---|---|---|
| KR | WO 2015072685 A1 * | 5/2015 | ........... G06F 3/0412 |

(Continued)

*Primary Examiner* — Sophia Nguyen
(74) *Attorney, Agent, or Firm* — Birch, Stewart, Kolasch & Birch, LLP

(57) ABSTRACT

A display device including a plurality of semiconductor light emitting devices, each corresponding semiconductor light emitting device having a first conductive electrode, a second conductive electrode and a light-emitting surface configured to emit light; a first wiring line electrically connected to the first conductive electrode; and a second wiring line disposed to cross the first conductive electrode, and be electrically connected to the second conductive electrode. Further, the second wiring line is formed to surround a periphery of the light-emitting surface of the semiconductor light emitting devices to reflect light emitted by the light emitting devices toward a front surface of the display device.

15 Claims, 23 Drawing Sheets

(51) Int. Cl.
*H01L 33/32* (2010.01)
*H01L 33/50* (2010.01)

(56) References Cited

U.S. PATENT DOCUMENTS

| | | | | |
|---|---|---|---|---|
| 6,452,341 B1 * | 9/2002 | Yamauchi | ................ | G09G 3/32 257/E29.004 |
| 6,576,926 B1 * | 6/2003 | Yamazaki | ........... | G02F 1/13454 257/347 |
| 7,164,155 B2 * | 1/2007 | Yamazaki | ........... | H01L 51/5256 257/57 |
| 8,772,797 B2 * | 7/2014 | Sagawa | ............... | H01L 27/3211 257/432 |
| 9,093,629 B2 * | 7/2015 | Rhee | ........................ | F21K 9/50 |
| 9,391,051 B2 * | 7/2016 | Rhee | ................... | H01L 25/0753 |
| 9,406,656 B2 * | 8/2016 | Lee | ............................. | H01L 33/38 |
| 2002/0158835 A1 * | 10/2002 | Kobayashi | .......... | H01L 27/3244 345/100 |
| 2004/0135175 A1 * | 7/2004 | Kurokawa | ............ | H01L 27/124 257/207 |
| 2004/0252117 A1 * | 12/2004 | Tanada | ..................... | G09G 3/32 345/212 |
| 2005/0012454 A1 * | 1/2005 | Yamazaki | ........... | H01L 27/3276 313/506 |
| 2005/0051776 A1 * | 3/2005 | Miyagi | ................ | G09G 3/3233 257/72 |
| 2005/0281303 A1 * | 12/2005 | Horio | ..................... | H01L 33/08 372/44.01 |
| 2006/0043510 A1 * | 3/2006 | Yamazaki | ............... | H01L 27/12 257/432 |
| 2007/0114512 A1 * | 5/2007 | Kumaki | .............. | H01L 51/5052 257/13 |
| 2007/0190887 A1 | 8/2007 | Sato et al. | | |
| 2008/0198109 A1 * | 8/2008 | Cho | ....................... | B82Y 20/00 345/87 |
| 2008/0218065 A1 * | 9/2008 | Ishihara | .............. | H01L 51/5228 313/504 |
| 2008/0284323 A1 * | 11/2008 | Kashiwabara | ...... | H01L 51/5203 313/504 |
| 2009/0029498 A1 * | 1/2009 | Yamazaki | ......... | H01J 37/32192 438/30 |
| 2009/0128017 A1 | 5/2009 | Sagawa et al. | | |
| 2010/0259164 A1 * | 10/2010 | Oohata | ............... | H01L 25/0753 313/505 |
| 2012/0001889 A1 * | 1/2012 | Kimura | .................. | G09G 3/344 345/212 |
| 2012/0092389 A1 * | 4/2012 | Okuyama | ................ | G09F 9/33 345/690 |
| 2012/0099048 A1 * | 4/2012 | Yamazaki | ......... | G02F 1/133514 349/62 |
| 2012/0205678 A1 * | 8/2012 | Ikeda | .................. | H01L 27/3276 257/88 |
| 2012/0205700 A1 * | 8/2012 | Tanada | ................ | H01L 27/3279 257/98 |
| 2013/0002730 A1 * | 1/2013 | Tanigawa | ............. | G02B 3/0018 345/690 |
| 2013/0187187 A1 * | 7/2013 | Matsukura | .......... | H01L 27/2436 257/99 |
| 2013/0262765 A1 * | 10/2013 | Tsutsui | ................ | G06F 12/0802 711/118 |
| 2015/0076458 A1 | 3/2015 | Lee et al. | | |
| 2015/0115296 A1 * | 4/2015 | Rhee | .................... | H01L 27/156 257/89 |
| 2015/0116985 A1 * | 4/2015 | Bang | ..................... | F21V 23/001 362/97.1 |
| 2015/0123106 A1 * | 5/2015 | Yasumoto | ............. | B32B 43/006 257/40 |
| 2015/0171297 A1 * | 6/2015 | Rhee | ........................ | F21K 9/50 362/231 |
| 2015/0221619 A1 * | 8/2015 | Rhee | ................... | H01L 25/0753 257/89 |
| 2015/0228865 A1 * | 8/2015 | Rhee | ..................... | H01L 27/156 257/90 |
| 2015/0249069 A1 * | 9/2015 | Yoshida | .................. | H01L 33/62 257/89 |
| 2015/0255505 A1 * | 9/2015 | Jeoung | .................. | G06F 1/1652 257/89 |
| 2015/0371941 A1 * | 12/2015 | Nakaiso | ............... | H01L 27/0814 257/499 |
| 2016/0044751 A1 * | 2/2016 | Ikeda | ...................... | H05B 33/02 362/227 |
| 2016/0126224 A1 * | 5/2016 | Lee | ......................... | H01L 33/38 257/89 |
| 2016/0155391 A1 * | 6/2016 | Takesue | ................ | G06F 3/1438 345/690 |
| 2016/0155755 A1 * | 6/2016 | Liu | ....................... | H01L 27/124 257/72 |
| 2016/0218142 A1 * | 7/2016 | Bang | ..................... | H01L 21/768 |
| 2016/0293805 A1 * | 10/2016 | Choi | .................. | H01L 25/0753 |
| 2016/0300745 A1 * | 10/2016 | Chang | ................. | H01L 25/0753 |
| 2016/0313848 A1 * | 10/2016 | Rhee | ..................... | G06F 3/0412 |
| 2016/0315068 A1 * | 10/2016 | Lee | .................... | H01L 25/0753 |
| 2016/0347047 A1 * | 12/2016 | Eguchi | .................. | B32B 43/006 |
| 2016/0349557 A1 * | 12/2016 | Shishido | ............. | G02F 1/13338 |
| 2016/0349903 A1 * | 12/2016 | Yun | ....................... | G06F 3/0416 |
| 2017/0012026 A1 * | 1/2017 | Choi | .................. | H01L 25/0753 |

FOREIGN PATENT DOCUMENTS

| | | | | |
|---|---|---|---|---|
| KR | WO 2016186376 A1 * | 11/2016 | ................ | F21S 2/00 |
| KR | WO 2017007215 A1 * | 1/2017 | ............ | F21K 99/00 |

* cited by examiner

DISPLAY DEVICE USING SEMICONDUCTOR LIGHT EMITTING DEVICE AND METHOD FOR MANUFACTURING THE SAME

CROSS-REFERENCE TO RELATED APPLICATIONS

This application claims the benefit of priority to Korean Patent Application No. 10-2015-0095987, filed on Jul. 6, 2015, the contents of which is herein expressly incorporated by reference in its entirety.

BACKGROUND OF THE INVENTION

1. Field of the Invention

The present disclosure relates to a display device and a fabrication method thereof, and more particularly, to a flexible display device using a semiconductor light emitting device.

2. Description of the Related Art

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs). However, there exist problems such as a slow response time, difficult implementation of flexibility in case of LCDs, and there exist drawbacks such as short life span, poor yield as well as low flexibility in case of AMOLEDs.

Further, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display, thereby presenting a scheme for solving the problems.

However, the light emitting efficiency of the semiconductor light emitting device is insufficient.

SUMMARY OF THE INVENTION

An aspect of the present disclosure is to provide a structure of enhancing luminance in a display device and a fabrication method thereof Another aspect of the present disclosure is to provide a display device using a semiconductor light emitting device capable of reducing a resistance of a wiring line as well as enhancing luminance and a fabrication method thereof A display device according to the present disclosure may include a semiconductor light emitting device having a first conductive electrode, a second conductive electrode and a light-emitting surface configured to emit light, a first wiring line electrically connected to the first conductive electrode, and a second wiring line disposed to cross the first conductive electrode, and electrically connected to the second conductive electrode. The display device may include a front surface and a rear surface, and the second wiring line can be formed to surround the light-emitting surface of the semiconductor light emitting device to reflect light toward the front surface in the periphery of the semiconductor light emitting device.

According to an embodiment, the second wiring line is formed in a trapezoidal shape. A plurality of through portions sequentially arranged along one direction to pass through the second wiring line can be formed on the second wiring line.

According to an embodiment, the second wiring line may include a line portion extended along one line to form a line, and electrically connected to the second conductive electrode, and a plurality of protrusion portions protruded in a direction perpendicular to the one direction on the line portion.

According to an embodiment, the second wiring lines may be sequentially deposited to have a plurality of layers formed of metal materials, respectively. The plurality of layers can be formed of different materials, respectively.

According to an embodiment, the display device may include a phosphor layer disposed to cover the plurality of semiconductor light emitting devices, and the second wiring line may surround the light-emitting surface of the semiconductor light emitting device to reflect light reflected from the phosphor layer toward the front surface. An antireflection layer can be formed at a lower portion of the phosphor layer.

In a display device according to the present disclosure, the wiring line can be formed to surround an exist surface of the semiconductor light emitting device, thereby reflecting light in the periphery of the semiconductor light emitting device to enhance luminance. In particular, according to such a structure, it is possible to re-reflect light reflected on the lower portion from light excited through the phosphor.

Furthermore, according to the present disclosure, excited light on a lateral surface may be blocked through an adhesive layer, thereby providing an effect of preventing color mixture.

Moreover, according to the present disclosure, in spite of fine pitch, a width of line may be increased, thereby having an effect of reducing a line resistance.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
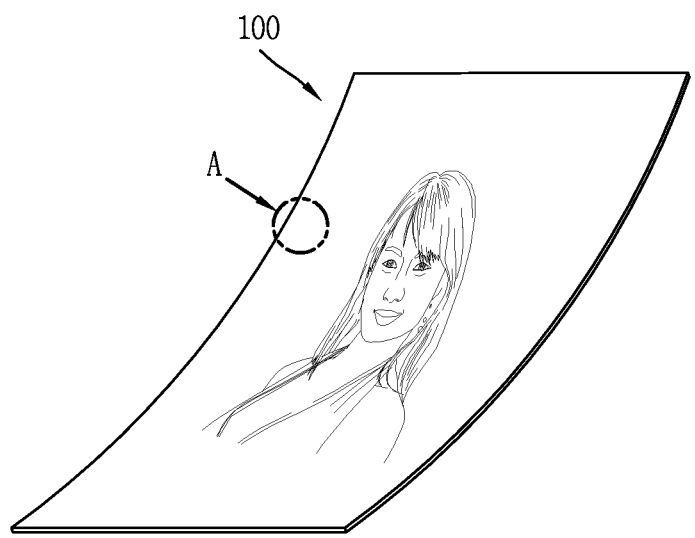
FIG. 1 is a conceptual view illustrating a display device using a semiconductor light emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. Also, it should be noted that the accompanying drawings are merely illustrated to easily explain the concept of the invention, and therefore, they should not be construed to limit the technological concept disclosed herein by the accompanying drawings. Furthermore, when an element such as a layer, region or substrate is referred to as being "on" another element, it can be directly on the other element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light emitting device according to an embodiment of the present disclosure. According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light emitting device. According to the present disclosure, a light emitting diode (LED) is illustrated as a type of semiconductor light emitting device. The light emitting diode can be formed with a small size to perform the role of a sub-pixel even in the second configuration through this.

Hereinafter, a flexible display implemented using the light emitting diode will be described in more detail with reference to the accompanying drawings. In particular, FIG. 2 is a partial enlarged view of portion "A" in FIG. 1, FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

Figure 2:
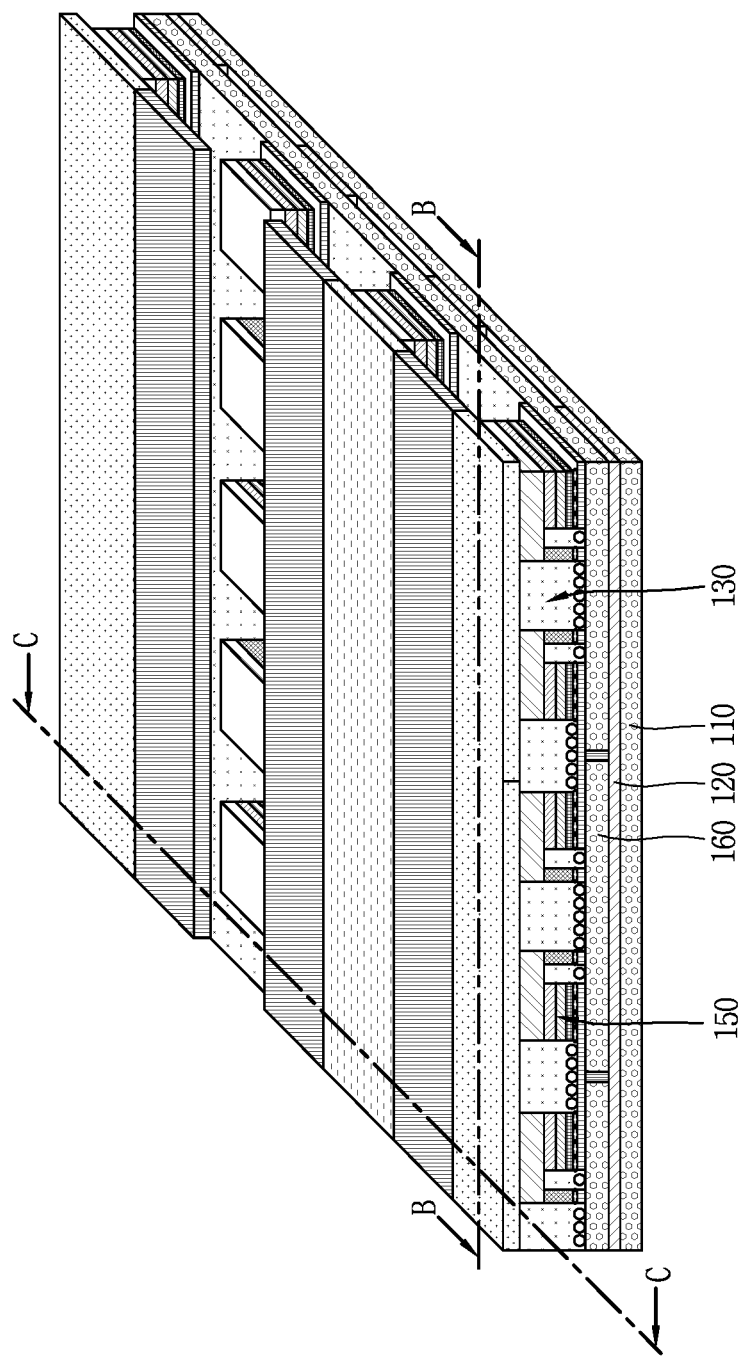
FIG. 2 is a partial enlarged view of portion "A" in FIG. 1, and FIGS. 3A and 3B are cross-sectional views taken along lines B-B and C-C in FIG. 2.
Figure 3A:
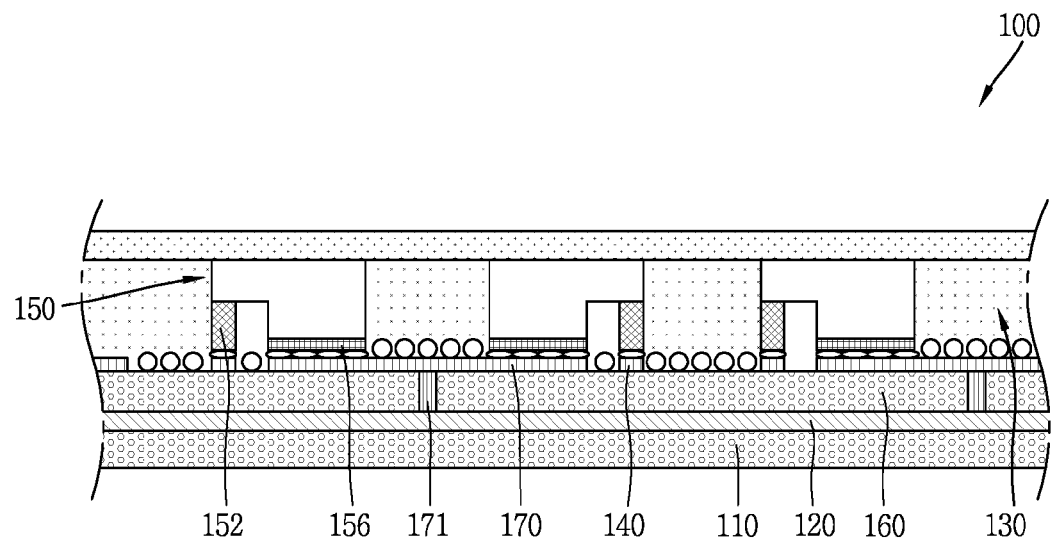
Figure 3B:
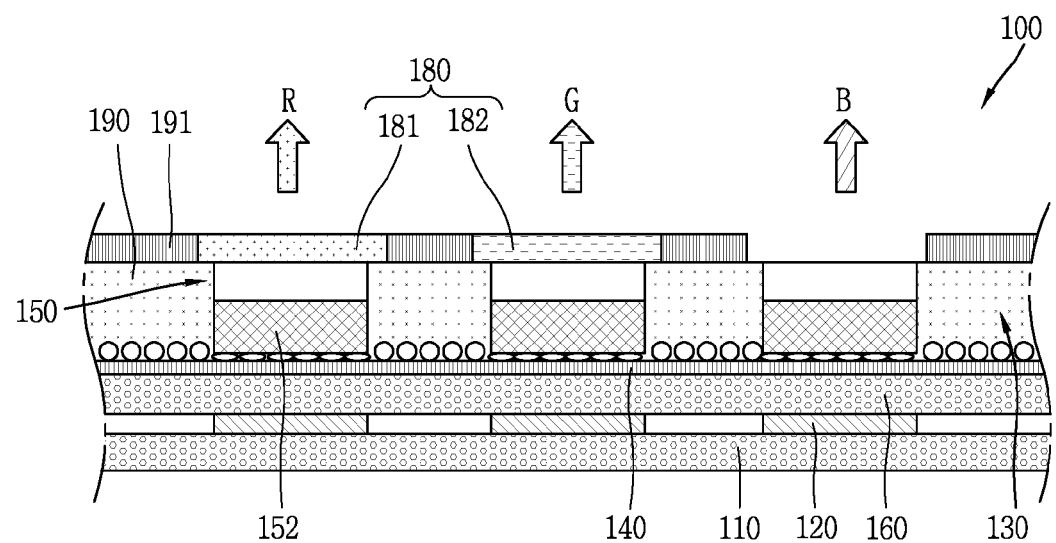
Figure 4:
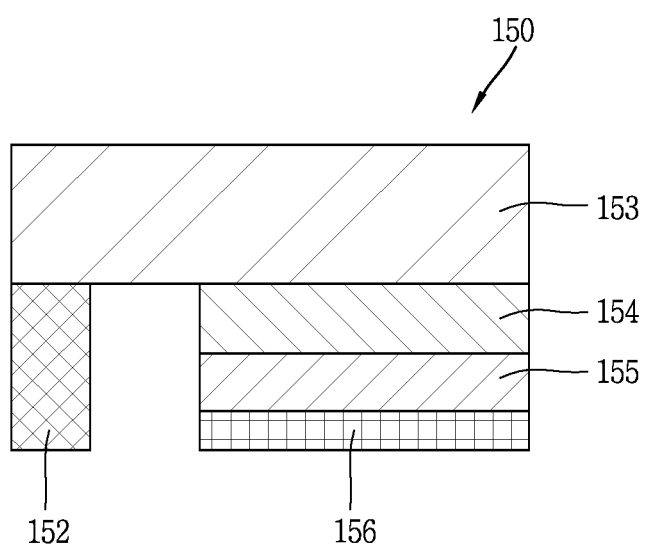
FIG. 4 is a conceptual view illustrating a flip-chip type semiconductor light emitting device in FIG. 3A.

According to the drawings in FIGS. 2, 3A and 3B, there is illustrated a display device 100 using a passive matrix (PM) type semiconductor light emitting device as a display device 100 using a semiconductor light emitting device. However, the following illustration may be also applicable to an active matrix (AM) type semiconductor light emitting device.

As shown, the display device 100 includes a substrate 110, a first electrode 120, a conductive adhesive layer 130, a second electrode 140, and a plurality of semiconductor light emitting devices 150. The substrate 110 may be a flexible substrate. The substrate 110 may contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials. The substrate 110 may be a wiring substrate disposed with the first electrode 120, and thus the first electrode 120 may be placed on the substrate 110.

According to the drawing, an insulating layer 160 can be disposed on the substrate 110 placed with the first electrode 120, and an auxiliary electrode 170 may be placed on the insulating layer 160. In this instance, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to form single wiring substrate.

The auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and may be electrically connected to the first electrode 120 by an electrode hole 171 passing through the insulating layer 160. The electrode hole 171 can be formed by filling a conductive material in a via hole.

Referring to the drawings, the conductive adhesive layer 130 can be formed on one surface of the insulating layer 160, but the present disclosure is not limited to this. For example, it is possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and a conductive material and an adhesive material may be mixed on the conductive adhesive layer 130. Furthermore, the conductive adhesive layer 130 has flexibility, thereby allowing a flexible function in the display device.

For example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof Accordingly, the conductive adhesive layer 130 may be referred to as a z-axis conductive layer (however, hereinafter referred to as a "conductive adhesive layer").

The anisotropic conductive film includes an anisotropic conductive medium mixed with an insulating base member, and thus when heat and pressure are applied thereto, only a specific portion thereof has conductivity by the anisotropic conductive medium. Hereinafter, heat and pressure are applied to the anisotropic conductive film, but other methods may be also available for the anisotropic conductive film to partially have conductivity. The methods include applying only either one of heat and pressure thereto, UV curing, and the like.

Furthermore, the anisotropic conductive medium may be conductive balls or particles. According to the drawing, in the present embodiment, the anisotropic conductive film includes an anisotropic conductive medium mixed with an insulating base member, and thus when heat and pressure are applied thereto, only a specific portion thereof has conductivity by the conductive balls. The anisotropic conductive film may include a core with a conductive material containing a plurality of particles coated by an insulating layer with a polymer material, and has a conductivity by the core while breaking an insulating layer on a portion to which heat and pressure are applied. Here, a core may be transformed to implement a layer having both surfaces to which objects contact in the thickness direction of the film.

In a more specific example, heat and pressure are applied to an anisotropic conductive film as a whole, and electrical connection in the z-axis direction is partially formed by a height difference from a mating object adhered by the use of the anisotropic conductive film. In another example, an anisotropic conductive film may be in a state containing a plurality of particles in which a conductive material is coated on insulating cores. In this instance, a portion to which heat and pressure are applied may be converted (pressed and adhered) to a conductive material to have conductivity in the thickness direction of the film. In still another example, it is fainted to have conductivity in the thickness direction of the film in which a conductive material passes through an insulating base member in the z-direction. In this instance, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure is not limited to this, and the anisotropic conductive film can include conductive balls randomly mixed with an insulating base member or a form configured with a plurality of layers in which conductive balls are disposed at any one layer (double-ACF), and the like. The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring to the drawing again, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed when the auxiliary electrode 170 and second electrode 140 are located, and then the semiconductor light emitting device 150 is connect thereto in a flip chip form with the application of heat and pressure, the semiconductor light emitting device 150 is electrically connected to the first electrode 120 and second electrode 140.

Referring to FIG. 4, the semiconductor light emitting device may be a flip chip type semiconductor light emitting device. For example, the semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this instance, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 can be formed in an elongated manner in one direction to be electrically connected to a plurality of semiconductor light emitting devices 150. For example, the left and right p-type electrodes of the semiconductor light emitting devices around the auxiliary electrode may be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device. Furthermore, a plurality of semiconductor light emitting devices 150 constitutes a light-emitting array, and a phosphor layer 180 is formed on the light-emitting array.

The light emitting device may include a plurality of semiconductor light emitting devices with different self luminance values. Each of the semiconductor light emitting devices 150 constitutes a sub-pixel, and is electrically connected to the first electrode 120. For example, there may exist a plurality of first electrodes 120, and the semiconductor light emitting devices are arranged in several rows, for instance, and each row of the semiconductor light emitting devices may be electrically connected to any one of the plurality of first electrodes.

Furthermore, the semiconductor light emitting devices may be connected in a flip chip form, and thus semiconductor light emitting devices grown on a transparent dielectric substrate. Furthermore, the semiconductor light emitting devices may be nitride semiconductor light emitting devices, for instance. The semiconductor light emitting device 150 has an excellent luminance characteristic, and thus it is possible to configure individual sub-pixels even with a small size thereof.

According to the drawing, a partition wall 190 can be formed between the semiconductor light emitting devices 150. In this instance, the partition wall 190 divides individual sub-pixels from one another, and be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 has reflective characteristics while at the same time increasing contrast with no additional black insulator. In another example, a reflective partition wall may be separately provided with the partition wall 190. In this instance, the partition wall 190 may include a black or white insulator according to the purpose of the display device. It has an effect of enhancing reflectivity when the partition wall of the while insulator is used, and increase contrast while at the same time having reflective characteristics.

The phosphor layer 180 may be located at an outer surface of the semiconductor light emitting device 150. For example, the semiconductor light emitting device 150 is a blue semiconductor light emitting device that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting device 151 at a location implementing a red sub-pixel, and a green phosphor 182 capable of converting blue light into green (G) light may be deposited on the blue semiconductor light emitting device 151 at a location implementing a green sub-pixel. Furthermore, only the blue semiconductor light emitting device 151 may be solely used at a location implementing a blue sub-pixel. In this instance, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed, thereby implementing sub-pixels.

However, the present disclosure is not limited to this, and the semiconductor light emitting device 150 may be combined with a quantum dot (QD) instead of a phosphor to implement sub-pixels such as red (R), green (G) and blue (B). Furthermore, a black matrix 191 can be disposed between each phosphor layer to enhance contrast. In other words, the black matrix 191 can enhance the contrast of luminance. However, the present disclosure is not limited to this, and another structure for implementing blue, red and green may be also applicable thereto.

Figure 5A:
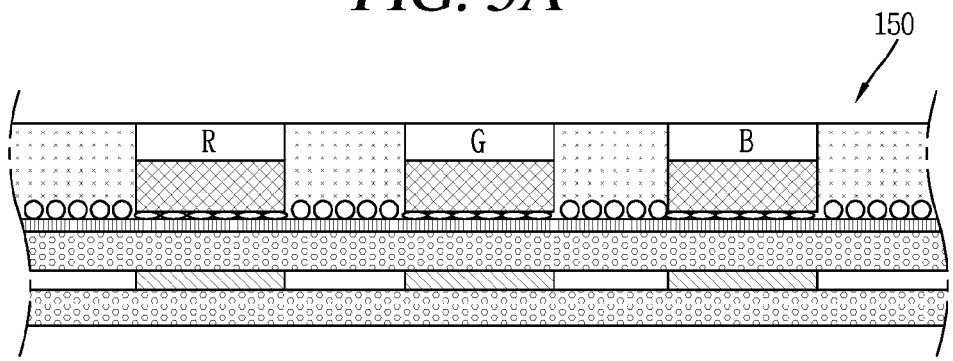
FIGS. 5A through 5C are conceptual views illustrating various forms for implementing colors in connection with a flip-chip type semiconductor light emitting device.

Referring to FIG. 5A, each of the semiconductor light emitting devices 150 can be implemented with a high-power light emitting device that emits various lights including blue in which gallium nitride (GaN) is mostly used, and indium (In) and or aluminum (Al) are added thereto. In this instance, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by the red, green and blue semiconductor light emitting devices, thereby implementing a full color display.

Figure 5B:
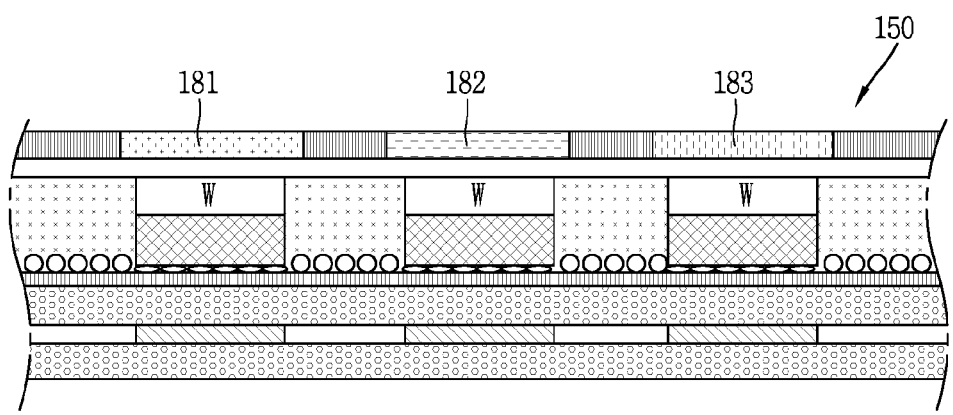

Referring to FIG. 5B, the semiconductor light emitting device has a white light emitting device (W) provided with a yellow phosphor layer for each element. In this instance, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
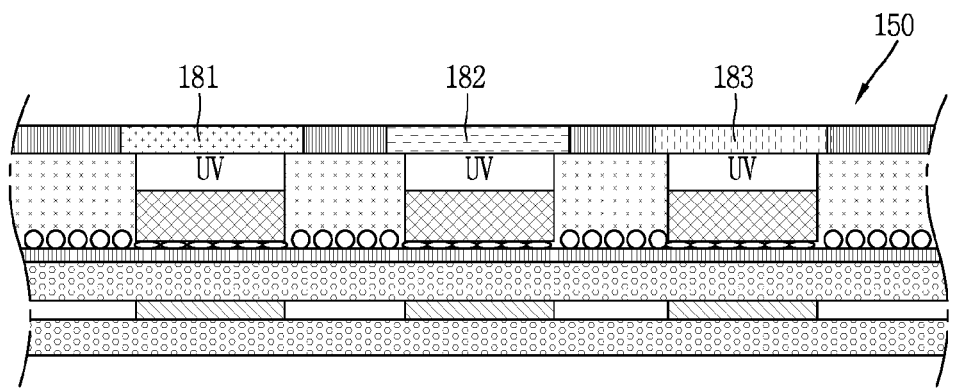

Referring to FIG. 5C, it is possible to also have a structure in which a red phosphor layer 181, a green phosphor layer 182 and blue phosphor layer 183 can be provided on a ultra violet light emitting device (UV). Thus, the semiconductor light emitting device can be used over the entire region up to ultra violet (UV) as well as visible light, and be extended to a form of semiconductor light emitting device in which ultra violet (UV) can be used as an excitation source.

Taking the present example into consideration again, the semiconductor light emitting device 150 is placed on the conductive adhesive layer 130 to configure a sub-pixel in the display device. The semiconductor light emitting device 150 has excellent luminance characteristics, and thus it is possible to configure individual sub-pixels even with a small size thereof The size of the individual semiconductor light emitting device 150 may be less than 80 μm in the length of one side thereof, and formed with a rectangular or square shaped element. For a rectangular shaped element, the size thereof may be less than 20×80 μm.

Furthermore, even when a square shaped semiconductor light emitting device 150 with a length of side of 10 μm is used for a sub-pixel, it will exhibit a sufficient brightness for implementing a display device. Accordingly, for a rectangular pixel in which one side of a sub-pixel is 600 μm in size, and the remaining one side thereof is 300 μm, a relative distance between the semiconductor light emitting devices becomes sufficiently large. Accordingly, it is possible to implement a flexible display device having a HD image quality.

Figure 6:
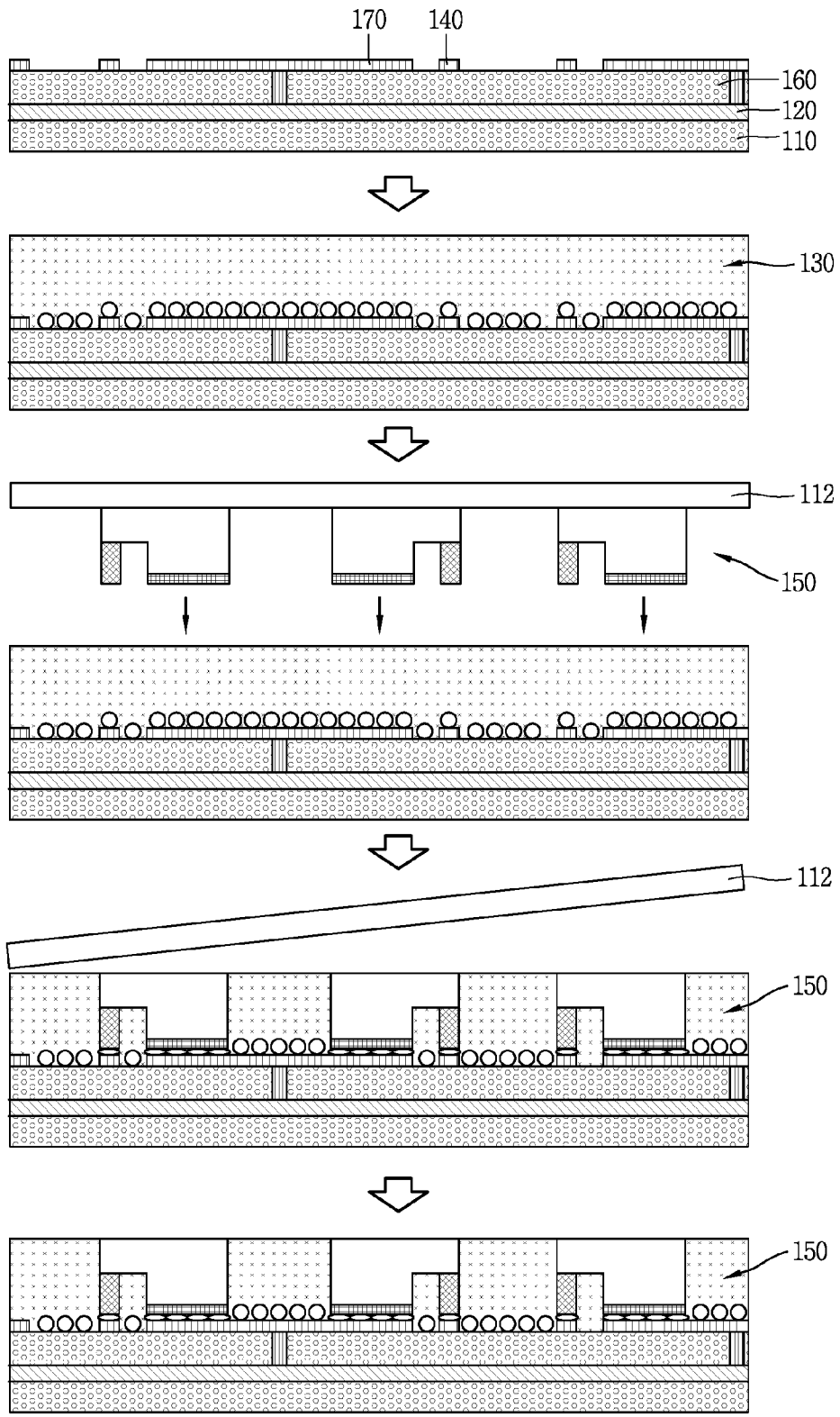
FIG. 6 is cross-sectional views illustrating a fabrication method of a display device using a semiconductor light emitting device according to the present disclosure.

A display device using the foregoing semiconductor light emitting device will be fabricated by a novel type of fabrication method. Hereinafter, the fabrication method will be described with reference to FIG. 6. In particular, FIG. 6 includes cross-sectional views illustrating a method of fabricating a display device using a semiconductor light emitting device according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In addition, the first electrode 120 and second electrode 140 are disposed in a perpendicular direction to each other.

Furthermore, the first substrate 110 and insulating layer 160 may contain glass or polyimide (PI), respectively, to implement a flexible display device. Further, the conductive adhesive layer 130 may be implemented by an anisotropic conductive film, for example, and an anisotropic conductive film may be coated on a substrate located with the insulating layer 160.

Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140. The second substrate 112 as a growth substrate for growing the semiconductor light emitting device 150 can be a sapphire substrate or silicon substrate. The semiconductor light emitting device has a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting device 150 and the auxiliary electrode 170 and second electrode 140 has conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method. Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer.

A process of forming a phosphor layer on one surface of the semiconductor light emitting device 150 may also be included. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

The fabrication method or structure of a display device using the foregoing semiconductor light emitting device may be modified in various forms. For example, the foregoing display device may be applicable to a vertical semiconductor light emitting device. Hereinafter, the vertical structure will be described with reference to FIGS. 5 and 6.

Figure 7:
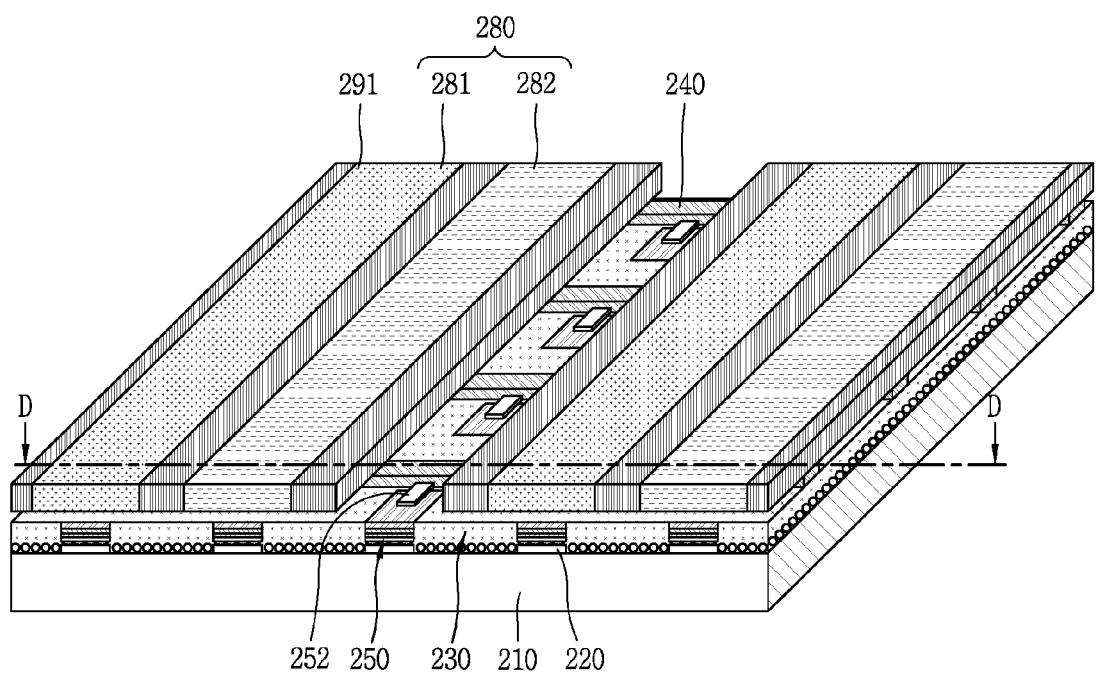
FIG. 7 is a perspective view illustrating a display device using a semiconductor light emitting device according to another embodiment of the present disclosure.
Figure 8:
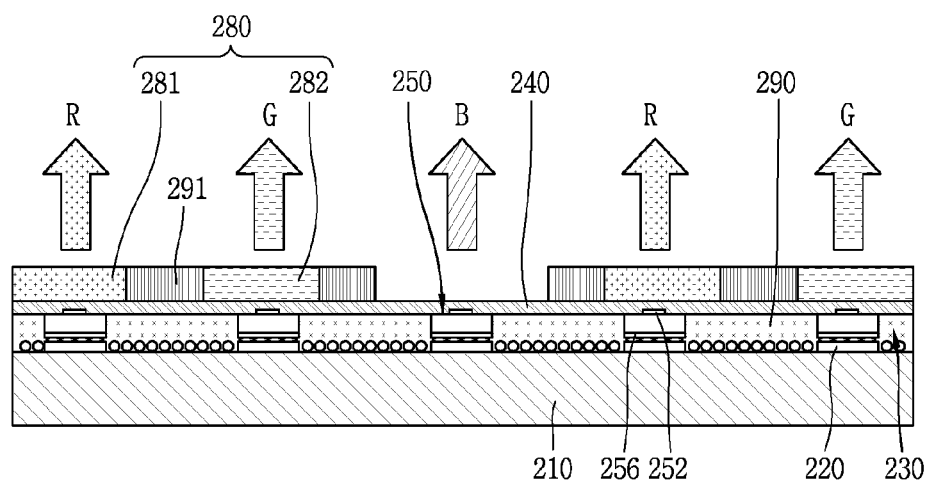
FIG. 8 is a cross-sectional view taken along line D-D in FIG. 7.
Figure 9:
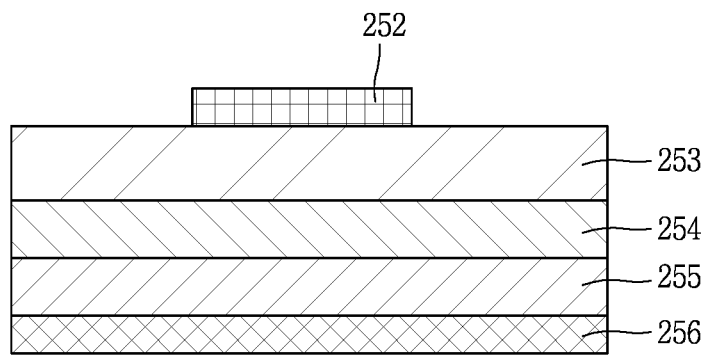
FIG. 9 is a conceptual view illustrating a vertical type semiconductor light emitting device in FIG. 8.

In particular, FIG. 7 is a perspective view illustrating a display device using a semiconductor light emitting device according to another embodiment of the present disclosure, FIG. 8 is a cross-sectional view taken along line C-C in FIG. 7, and FIG. 9 is a conceptual view illustrating a vertical type semiconductor light emitting device in FIG. 8.

According to the drawings, the display device is using a passive matrix (PM) type of vertical semiconductor light emitting device. As shown, the display device includes a substrate 210, a first electrode 220, a conductive adhesive layer 230, a second electrode 240 and a plurality of semiconductor light emitting devices 250.

The substrate 210 as a wiring substrate disposed with the first electrode 220 may include polyimide (PI) to implement a flexible display device. In addition, any one may be used if it is an insulating and flexible material. The first electrode 220 may be located on the substrate 210, and formed with a bar-shaped electrode elongated in one direction. The first electrode 220 can be formed to perform the role of a data electrode.

The conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates when the conductive adhesive layer 230 is implemented by an anisotropic conductive film.

When an anisotropic conductive film is located in a state that the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof Furthermore, the anisotropic conductive film contains an adhesive component, and thus the conductive adhesive layer 230 implements a mechanical coupling as well as an electrical coupling between the semiconductor light emitting device 250 and the first electrode 220.

Thus, the semiconductor light emitting device 250 is placed on the conductive adhesive layer 230, thereby configuring a separate sub-pixel in the display device. The semiconductor light emitting device 250 has excellent luminance characteristics, and thus it is possible to configure individual sub-pixels even with a small size thereof The size of the individual semiconductor light emitting device 250 may be less than 80 μm in the length of one side thereof, and formed with a rectangular or square shaped element. In case of a rectangular shaped element, the size thereof may be less than 20×80 μm.

The semiconductor light emitting device 250 may be a vertical structure. A plurality of second electrodes 240 disposed in a direction of crossing the length direction of the first electrode 220, and electrically connected to the vertical semiconductor light emitting device 250 may be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this instance, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes can be disposed in the upward/downward direction in the vertical semiconductor light emitting device 250, thereby providing a great advantage capable of reducing the chip size.

Referring to FIG. 8 again, a phosphor layer 280 can be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this instance, the phosphor layer 280 may be a red phosphor 281 and a green phosphor 282 constituting individual pixels.

In other words, a red phosphor 281 capable of converting blue light into red (R) light may be deposited on the blue semiconductor light emitting device 251 at a location implementing a red sub-pixel, and a green phosphor 282 capable of converting blue light into green (G) light may be deposited on the blue semiconductor light emitting device 251 at a location implementing a green sub-pixel. Furthermore, only the blue semiconductor light emitting device 251 may be solely used at a location implementing a blue sub-pixel. In this instance, the red (R), green (G) and blue (B) sub-pixels may implement one pixel. However, the present disclosure is not limited to this, and another structure for implementing blue, red and green may be also applicable thereto as described above in a display device to which a flip chip type light emitting device is applied.

Taking the present embodiment into consideration again, the second electrode 240 is located between the semiconductor light emitting devices 250, and electrically connected to the semiconductor light emitting devices 250. For example, the semiconductor light emitting devices 250 can be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250. The second electrode 240 can be formed with a bar-shaped electrode elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Thus, the second electrode 240 may be electrically connected to the n-type electrode of the semiconductor light emitting device 250.

According to the drawing, the second electrode 240 may be located on the conductive adhesive layer 230. According to circumstances, a transparent insulating layer containing silicon oxide (SiOx) can be formed on the substrate 210 foamed with the semiconductor light emitting device 250. When the transparent insulating layer is formed and then the second electrode 240 is placed thereon, the second electrode 240 may be located on the transparent insulating layer. Furthermore, the second electrode 240 can be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 can be formed between the semiconductor light emitting devices 250. In other words, the partition wall 290 can be disposed between the vertical semiconductor light emitting devices 250 to isolate the semiconductor light emitting device 250 constituting individual pixels. In this instance, the partition wall 290 divides individual sub-pixels from one another, and be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 has reflective characteristics while at the same time increasing contrast with no additional black insulator. In another example, a reflective partition wall may be separately provided with the partition wall 290. In this instance, the partition wall 290 may include a black or white insulator according to the purpose of the display device.

If the second electrode 240 is precisely located on the conductive adhesive layer 230 between the semiconductor light emitting devices 250, the partition wall 290 may be located between the semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display device having a HD image quality. Furthermore, according to the drawing, a black matrix 291 can be disposed between each phosphor layer to enhance contrast. In other words, the black matrix 191 can enhance the contrast of luminance.

As described above, the semiconductor light emitting device 250 is located on the conductive adhesive layer 230, thereby constituting individual pixels on the display device. Since the semiconductor light emitting device 250 has excellent luminance characteristics, thereby configuring individual sub-pixels even with a small size thereof As a result, it is possible to implement a full color display in which the sub-pixels of red (R), green (G) and blue (B) implement one pixel by the semiconductor light emitting device.

In a display device using a semiconductor light emitting device according to the present disclosure as described above, it may be difficult to implement a fine pitch since a first and a second electrode are arranged on the same plane when a flip chip type is applied thereto. Hereinafter, a display device to which a flip chip type semiconductor light emitting device according to another embodiment of the present disclosure capable of solving this problem is applied will be described in more detail.

Figure 10:
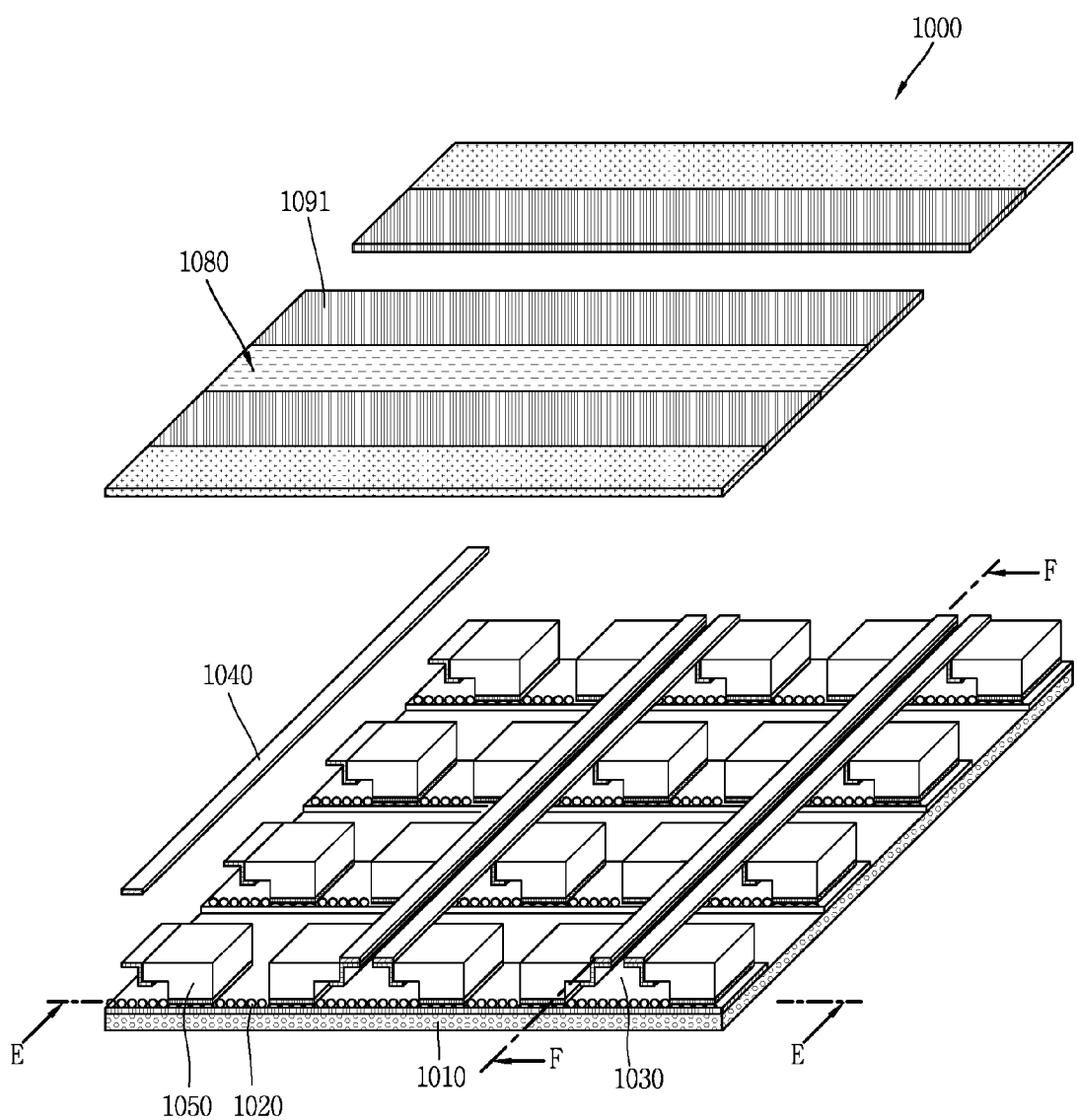
FIG. 10 is an enlarged view illustrating portion "A" in FIG. 1 illustrating another embodiment of the present disclosure to which a new type semiconductor light emitting device is applied.
Figure 11A:
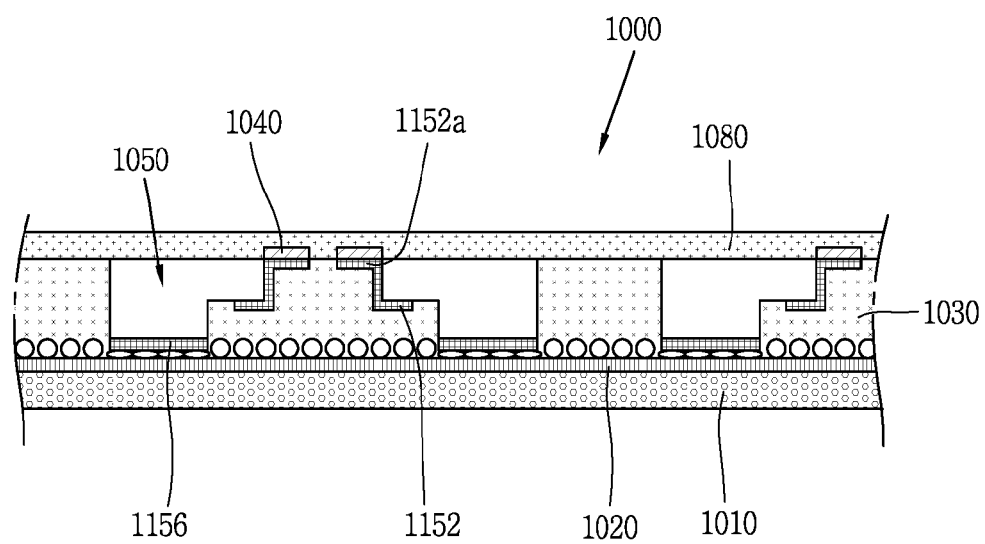
FIG. 11A is a cross-sectional view taken along line E-E in FIG. 10.
Figure 11B:
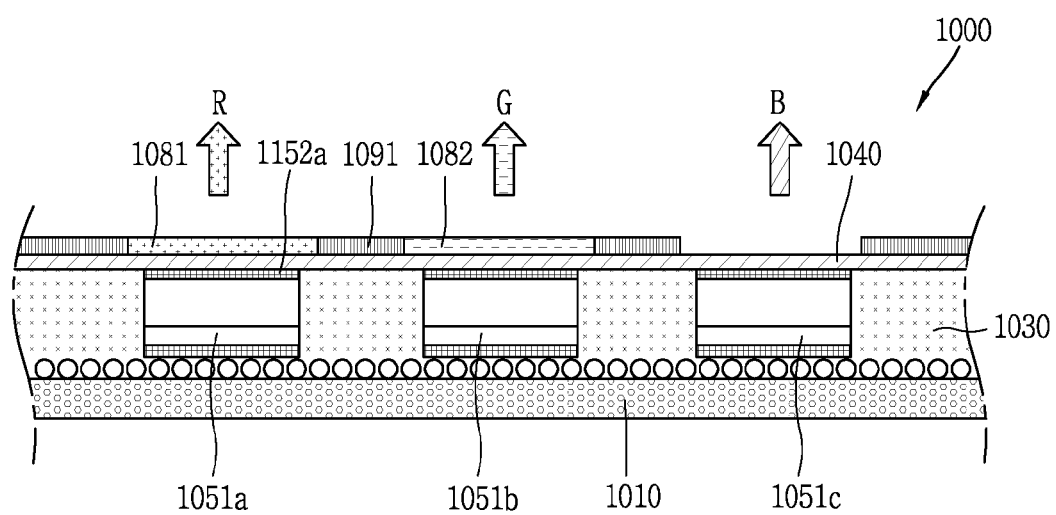
FIG. 11B is a cross-sectional view taken along line F-F in FIG. 10.
Figure 12:
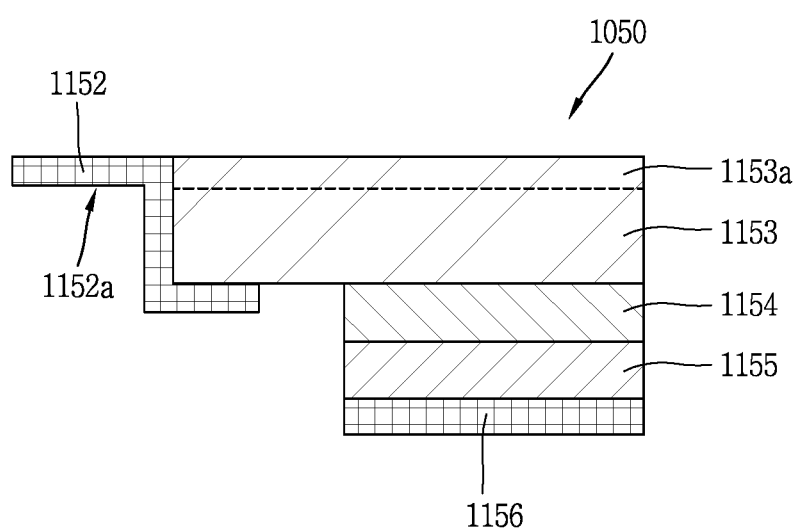
FIG. 12 is a conceptual view illustrating a flip chip type semiconductor light emitting device in FIG. 11A.

In particular, FIG. 10 is an enlarged view illustrating portion "A" in FIG. 1 illustrating another embodiment of the present disclosure to which a new type semiconductor light emitting device is applied, FIG. 11A is a cross-sectional view taken along line E-E in FIG. 10, FIG. 11B is a cross-sectional view taken along line F-F in FIG. 10, and FIG. 12 is a conceptual view illustrating a flip chip type semiconductor light emitting device in FIG. 11A.

Referring to FIGS. 10, 11A and 11B, there is illustrated a display device 1000 using a passive matrix (PM) type semiconductor light emitting device as a display device 1000 using a semiconductor light emitting device. However, the following illustration may be also applicable to an active matrix (AM) type semiconductor light emitting device.

The display device 1000 may include a substrate 1010, a first electrode 1020, a conductive adhesive layer 1030, a second electrode 1040, and a plurality of semiconductor light emitting devices 1050. Here, the first electrode 1020 and second electrode 1040 may include a plurality of electrode lines, respectively.

The substrate 1010 as a wiring substrate on which the first electrode 1020 is disposed may include polyimide (PI) to implement a flexible display device. In addition, any one may be used if it is an insulating and flexible material. The first electrode 1020 may be located on the substrate 1010, and formed with a bar-shaped electrode elongated in one direction. The first electrode 1020 can be formed to perform the role of a data electrode.

The conductive adhesive layer 1030 is formed on the substrate 1010 located with the first electrode 1020. Similarly to a display device to which a flip chip type light emitting device is applied, the conductive adhesive layer 1030 may be an anisotropic conductive film (ACF), an anisotropic conductive paste, a solution containing conductive particles, and the like. However, the conductive adhesive layer 1030 may be replaced with an adhesive layer. For example, if the first electrode 1020 is formed integrally with a conductive electrode of the semiconductor light emitting device without being located on the substrate 1010, then the adhesive layer may not be required.

A plurality of second electrodes 1040 disposed in a direction of crossing the length direction of the first electrode 1020, and electrically connected to the semiconductor light emitting device 1050 may be located between the semiconductor light emitting devices. According to the drawing, the second electrode 1040 may be located on the conductive adhesive layer 1030. In other words, the conductive adhesive layer 1030 is disposed between the wiring substrate and the second electrode 1040. The second electrode 1040 may be electrically connected thereto due to a contact with the semiconductor light emitting device 1050.

Due to the foregoing structure, the plurality of semiconductor light emitting devices 1050 are coupled to the conductive adhesive layer 1030, and electrically connected to the first electrode 1020 and second electrode 1040. According to circumstances, a transparent insulating layer containing silicon oxide (SiOx) can be formed on the substrate 1010 formed with the semiconductor light emitting device 1050. When the transparent insulating layer is formed and then the second electrode 1040 is placed thereon, the second electrode 1040 may be located on the transparent insulating layer. Furthermore, the second electrode 1040 can be formed to be separated from the conductive adhesive layer 1030 or transparent insulating layer.

As illustrated in the drawing, the plurality of semiconductor light emitting devices 1050 form a plurality of columns in a direction in parallel to a plurality of electrode lines provided in the first electrode 1020. However, the present disclosure is not limited to this. For example, the plurality of semiconductor light emitting devices 1050 may form a plurality of columns along the second electrode 1040.

Moreover, the display device 1000 may further include a phosphor layer 1080 formed on one surface of the plurality of semiconductor light emitting devices 1050. For example, the semiconductor light emitting device 1050 is a blue semiconductor light emitting device that emits blue (B) light, and the phosphor layer 1080 performs the role of converting the blue (B) light into the color of a sub-pixel. The phosphor layer 1080 may be a red phosphor layer 1081 or green phosphor layer 1082 constituting individual pixels. In other words, a red phosphor 1081 capable of converting blue light into red (R) light may be deposited on the blue semiconductor light emitting device 1051 at a location implementing a red sub-pixel, and a green phosphor 1082 capable of converting blue light into green (G) light may be deposited on the blue semiconductor light emitting device 1051b at a location implementing a green sub-pixel. Furthermore, only the blue semiconductor light emitting device 1051c may be solely used at a location implementing a blue sub-pixel.

In this instance, the red (R), green (G) and blue (B) sub-pixels may implement one pixel. More specifically, one color phosphor may be deposited along each line of the first electrode 1020. Accordingly, one line on the first electrode 1020 may be an electrode controlling one color. In other words, red (R), green (B) and blue (B) may be sequentially disposed along the second electrode 1040, thereby implementing sub-pixels. However, the present disclosure is not limited to this, and the semiconductor light emitting device 1050 may be combined with a quantum dot (QD) instead of a phosphor to implement sub-pixels such as red (R), green (G) and blue (B).

Further, the display device may further include a black matrix 1091 disposed between each phosphor to enhance the contrast of the phosphor layer 1080. The black matrix 1091 can be formed so a gap is made between phosphor dots, and a black material fills into the gap. Thus, the black matrix 1091 may enhance the contrast between light and shade while at the same time absorbing external light reflection. The black matrix 1091 is located between each phosphor along the first electrode 1020 in a direction on which the phosphor layer 1080 is deposited. In this instance, a phosphor layer is not formed at a location corresponding to the blue semiconductor light emitting device 1051, but black matrices can be formed at both sides by interposing a space with no the phosphor layer therebetween (or interposing the blue semiconductor light emitting device 1051c therebetween).

Referring to the semiconductor light emitting device 1050 according to the present disclosure again, for the semiconductor light emitting device 1050 in the present illustration, electrodes are disposed at the top/bottom, thereby having an advantage of reducing the chip size. However, the electrodes are disposed at both the top/bottom, but a semiconductor light emitting device according to the present disclosure may be a flip chip type light emitting device.

Referring to FIG. 12, for example, the semiconductor light emitting device 1050 may include a first conductive electrode 1156, a first conductive semiconductor layer 1155 formed with the first conductive electrode 1156, an active layer 1154 formed on the first conductive semiconductor layer 1155, and a second conductive semiconductor layer 1153 formed on the active layer 1154 and a second conductive electrode 1152 formed on the second conductive semiconductor layer 1153.

More specifically, the first conductive electrode 1156 and first conductive semiconductor layer 1155 may be a p-type electrode and a p-type semiconductor layer, respectively, and the second conductive electrode 1152 and second conductive semiconductor layer 1153 may be an n-type electrode and an n-type semiconductor layer, respectively. However, the present disclosure is not limited to this, and includes the first conductive type is an n-type and the second conductive type is a p-type.

More specifically, the first conductive electrode 1156 is formed on one surface of the first conductive semiconductor layer 1155, and the active layer 1154 is formed between the other surface of the first conductive semiconductor layer 1155 and one surface of the second conductive semiconductor layer 1153, and the second conductive electrode 1152 is formed on one surface of the second conductive semiconductor layer 1153.

In this instance, the second conductive electrode can be disposed on one surface of the second conductive semiconductor layer 1153, and an undoped semiconductor layer 1153a can be formed on the other surface of the second conductive semiconductor layer 1153. Referring to FIG. 12 along with FIGS. 10 through 11B, one surface of the second conductive semiconductor layer may be a surface which is the closest to the wiring substrate, and the other surface of the second conductive semiconductor layer may be a surface which is the farthest surface from the wiring substrate.

Furthermore, the first conductive electrode 1156 and second conductive electrode 1152 are formed to have a height difference in the width direction and vertical direction (or thickness direction) at a separated position along the width direction of the semiconductor light emitting device.

The second conductive electrode 1152 is formed on the second conductive semiconductor layer 1153 using the height difference, but disposed adjacent to the second electrode 1040 located at an upper side of the semiconductor light emitting device. For example, at least part of the second conductive electrode 1152 may be protruded along the width direction from a lateral surface of the second conductive semiconductor layer 1153 (or lateral surface of the undoped semiconductor layer 1153a). Thus, since the second conductive electrode 1152 is protruded from the lateral surface, the second conductive electrode 1152 may be exposed to an upper side of the semiconductor light emitting device. Thus, the second conductive electrode 1152 is disposed at a position overlapping with the second electrode 1040 disposed at an upper side of the conductive adhesive layer 1030.

More specifically, the semiconductor light emitting device may include a protrusion portion 1152a extended from the second conductive electrode 1152, and protruded from a lateral surface of the plurality of semiconductor light emitting devices. In this instance, based on the protrusion portion 1152a, it is expressed that the first conductive electrode 1156 and second conductive electrode 1152 are disposed at a separated position along the protrusion direction of the protrusion portion 1152a, and formed to have a height difference from each other in a direction perpendicular to the protrusion direction.

The protrusion portion 1152a is extended from one surface of the second conductive semiconductor layer 1153 to a lateral surface thereof, and extended to an upper surface of the second conductive semiconductor layer 1153, more particularly, the undoped semiconductor layer 1153a. The protrusion portion 1152a is protruded along the width direction from a lateral surface of the undoped semiconductor layer 1153a. Accordingly, the protrusion portion 1152a may be electrically connected to the second electrode 1040 at an opposite side to the first conductive electrode based on the second semiconductor layer.

The structure having the protrusion portion 1152a may be a structure in which advantages of the foregoing horizontal semiconductor light emitting device and vertical semiconductor light emitting device can be used. Meanwhile, fine grooves can be fanned by roughing on an upper surface which is the farthest from the first conductive electrode 1156 on the undoped semiconductor layer 1153a.

According to the foregoing display device, light emitted from semiconductor light emitting devices is excited using phosphors to implement red (R) and green (G). This occurs when light excited by the phosphor is unable to get out of the front surface of the display device and advance toward the rear surface of the display device. In such a case, the luminance of display device may be reduced. Furthermore, since the foregoing display device according to the present disclosure is provided with a small size of semiconductor light emitting device, thereby causing difficulty in increasing the luminance of display device.

Figure 13:
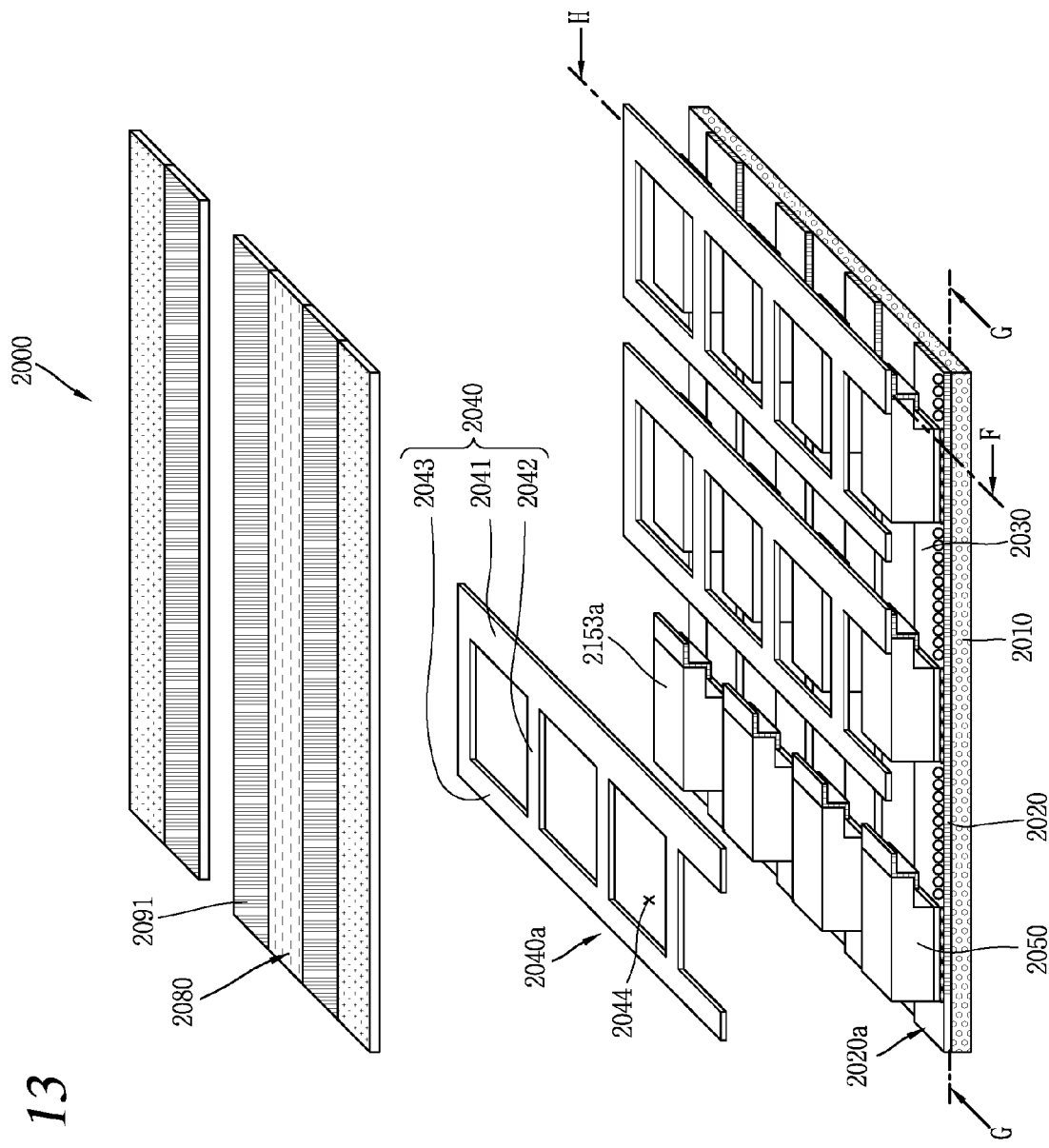
FIG. 13 is an enlarged view illustrating portion "A" in FIG. 1 illustrating another embodiment of the present disclosure.
Figure 14:
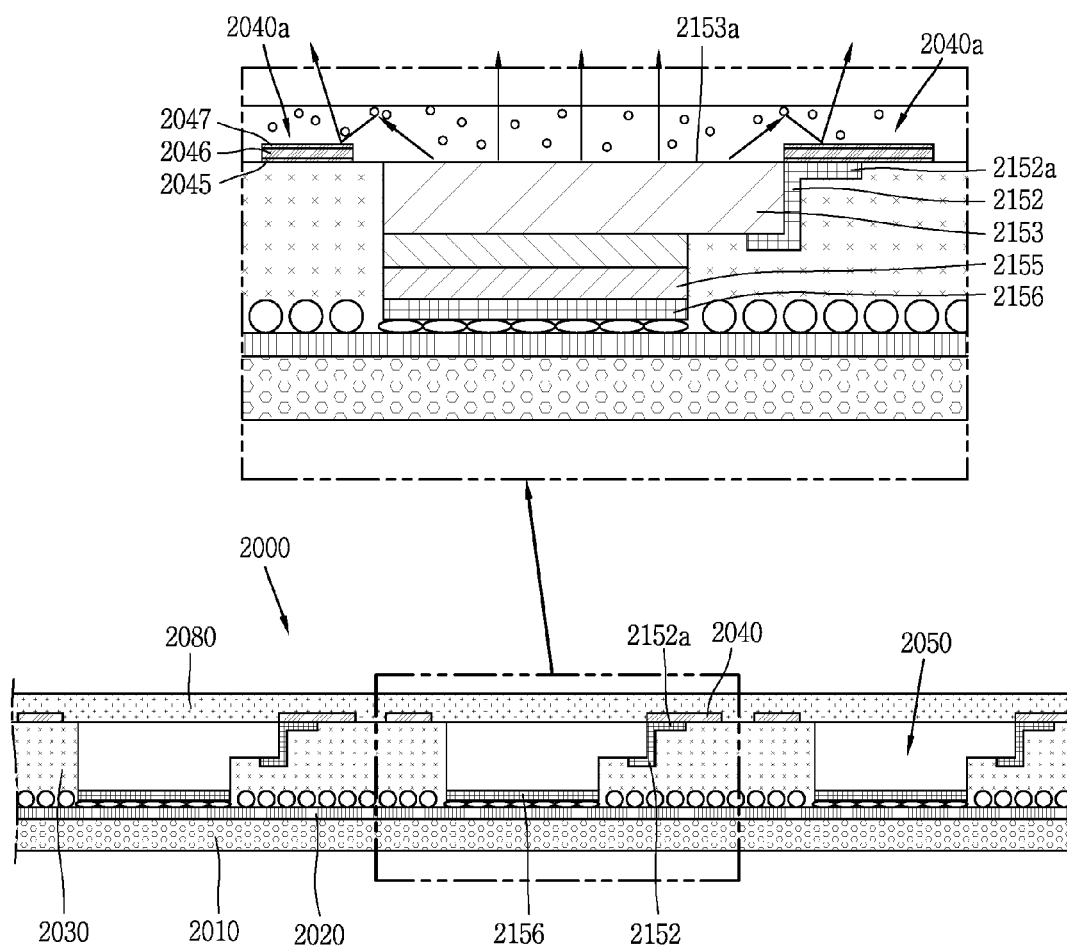
FIG. 14 is a cross-sectional view taken along line G-G in FIG. 13.
Figure 15:
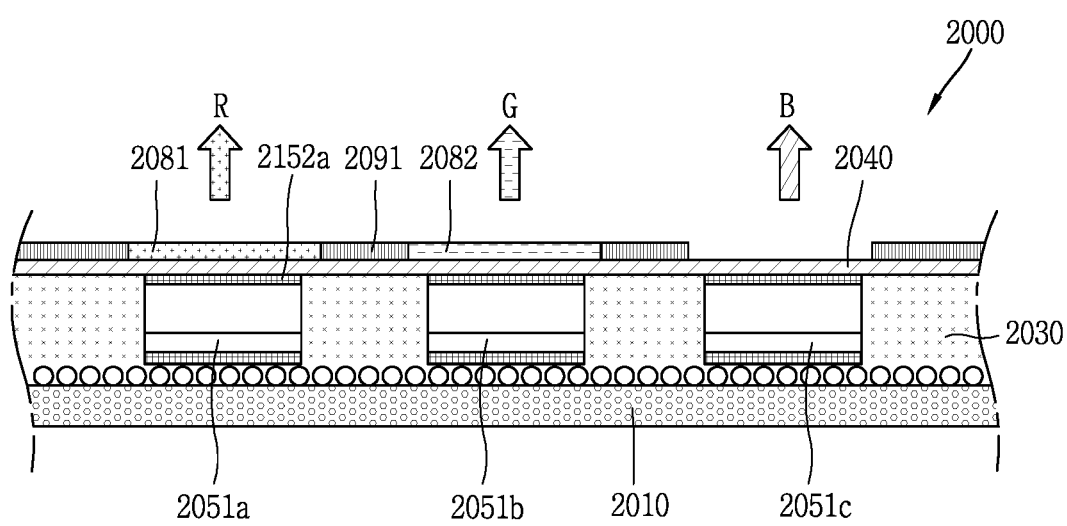
FIG. 15 is a cross-sectional view taken along line H-H in FIG. 13.
Figure 16:
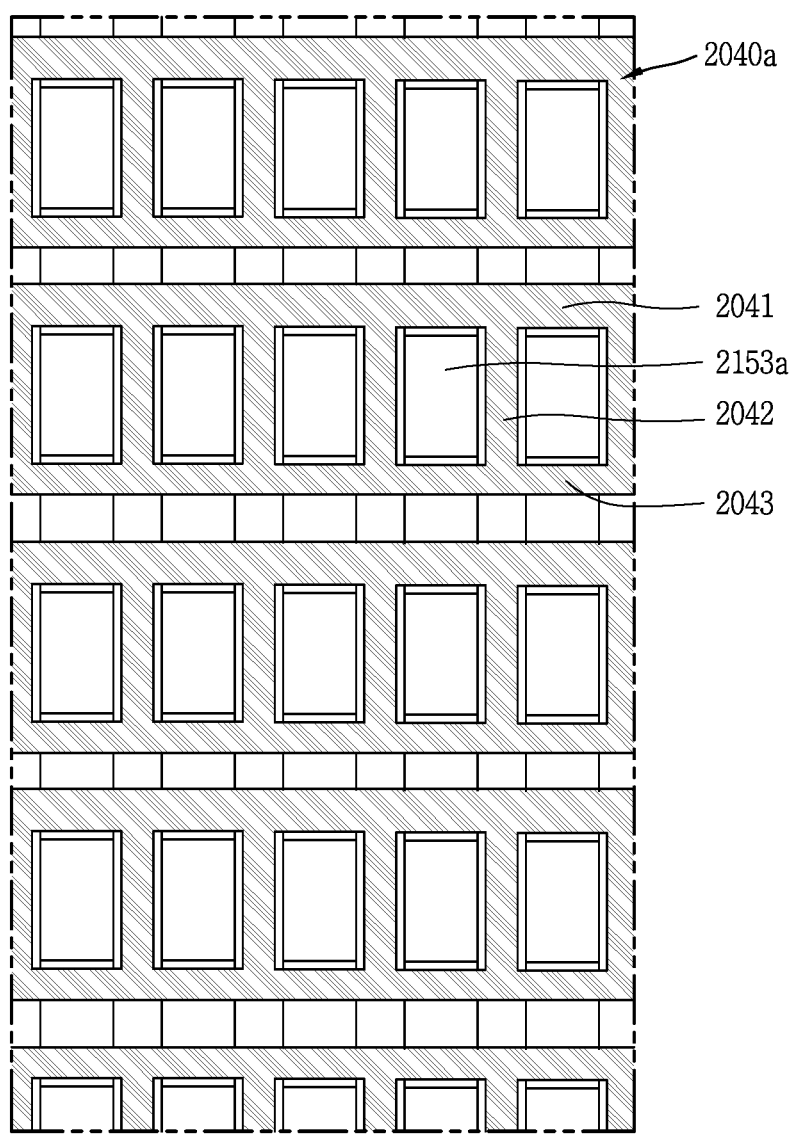
FIG. 16 is a plan view of FIG. 13.

The present disclosure presents a novel structure of semiconductor light emitting device capable of solving such a problem. Hereinafter, a display device to which a new structure of semiconductor light emitting device is applied and a fabrication method thereof will be described. In particular, FIG. 13 is an enlarged view illustrating portion "A" in FIG. 1 illustrating another embodiment of the present disclosure, FIG. 14 is a cross-sectional view taken along line G-G in FIG. 13, and FIG. 15 is a cross-sectional view taken along line H-H in FIG. 13, and FIG. 16 is a plan view of FIG. 13.

FIGS. 13 to 16 illustrate a display device 2000 using a flip chip type semiconductor light emitting device described with reference to FIGS. 10 through 12. More specifically, a novel structure of phosphor layer is applied to a flip chip type semiconductor light emitting device described with reference to FIGS. 10 through 12. However, the example described below may be also applicable to a display device using the foregoing different type of semiconductor light emitting device (for example, a vertical type semiconductor light emitting device).

As shown, the display device 2000 includes a substrate 2010, a first electrode 2020, a conductive adhesive layer 2030, a second electrode 2040 and a plurality of semiconductor light emitting devices 2050, and the description thereof will substituted by the description with reference to FIGS. 10 through 12. Accordingly, the conductive adhesive layer 2030 according to the present embodiment may be replaced with an adhesive layer, and adhered to an adhesive layer in which a plurality of semiconductor light emitting devices are disposed on the substrate 2010, and the first electrode 2020 may be integrally formed with a conductive electrode of the semiconductor light emitting device without being located on the substrate 2010. A phosphor layer 2080 and a black matrix 2091 are also shown in FIGS. 13 and 15.

The second electrode 2040 may be located on the conductive adhesive layer 2030. In other words, the conductive adhesive layer 2030 is disposed between the wiring substrate and the second electrode 2040. The second electrode 2040 may be electrically connected to the plurality of semiconductor light emitting devices 2050 by contact therewith.

Here, the first electrode 2020 and second electrode 2040 may include a plurality of wiring lines, respectively. In this instance, the first electrode 2020 may include a first wiring line 2020a electrically connected to a first conductive electrode 2156, and the second electrode 2040 is disposed to cross the first wiring line, and may include a second wiring line 2040a electrically connected to a second conductive electrode 2152. Meanwhile, the first wiring line 2020a may be a data wiring line for transmitting a data signal, and the second wiring line 2040a may be a scan wiring line for transmitting a scan signal. However, the present disclosure is not limited to this, and the first wiring line 2020a may be a scan wiring line, and the second wiring line 2040a may be a data wiring line.

Referring to FIGS. 13 and 16, the second wiring line 2040a is formed to surround a light-emitting surface 2153a of the semiconductor light emitting device to reflect light toward the front surface of the display device in the periphery of the semiconductor light emitting device. In this instance, the light-emitting surface 2153a as a surface out of which light goes to an outside can be an upper surface of the second conductive semiconductor layer 2153 of the semiconductor light emitting device. When the semiconductor light emitting device includes an undoped semiconductor layer, the light-emitting surface 2153a can be an upper surface of the undoped semiconductor layer.

In a more specific example, the second wiring line 2040a may include a line portion 2041 and a plurality of protrusion portions 2042. The line portion 2041 is extended in one direction to form a line, and electrically connected to the second conductive electrode 2152, and the plurality of protrusion portions 2042 are protruded from the line portion 2041 in a direction perpendicular to the one direction. In this instance, each semiconductor light emitting device can be disposed between the plurality of protrusion portions 2042.

Furthermore, the second wiring line 2040a can be disposed in parallel to the line portion 2041, and may include a parallel portion 2043 connected to the protrusion portions 2042. More specifically, the end portions of the protrusion portions 2042, respectively, may be connected to the parallel portion 2043. According to such a structure, each semiconductor light emitting device can be disposed between the line portion 2041 and the parallel portion 2043. Since there is a contact with the second conductive electrode 2152 on the line portion 2041, the line portion 2041 can be formed to have a larger width.

In other words, the parallel portion 2043 can be formed to have a smaller width than that of the line portion 2041. In this instance, the protrusion portions 2042 can be formed to have a smaller width than that of the line portion 2041. Furthermore, the width of the wiring line can be formed with 50 to 80 percent of a distance between the semiconductor light emitting devices. Thus, the parallel portion 2043 or protrusion portions 2042 are formed to have a smaller width than that of the line portion 2041, thereby fanning a wiring line with a larger area without obscuring light emitted from a lateral surface of the semiconductor light emitting device.

For example, the width of the line portion 2041 can be 37.5 to 85 percent of a distance between the semiconductor light emitting devices, and the width of the parallel portion 2043 can be in a range of 12.5 to 50 percent of a distance between the semiconductor light emitting devices. For a specific example, the width of the line portion 2041 can be 15 to 25 micrometers, and the width of the parallel portion 2043 can be 5 to 15 micrometers, and a distance between each column of the semiconductor light emitting devices can be 30 to 40 micrometers.

Furthermore, the width of the protrusion portions 2042 can be 4 to 6 micrometers, and a distance between the semiconductor light emitting devices within the column can be 8 to 10 micrometers. The second wiring line 2040a can be formed in a trapezoidal shape as the protrusion portions 2042 are repeatedly disposed at predetermined intervals, and the semiconductor light emitting device can be disposed in an inner vacant space in a trapezoidal shape. The vacant space may be through portions 2044 configured to pass through the second wiring line 2040a along a thickness direction of the display device. In other words, a plurality of through portions 2044 sequentially arranged along one direction to pass through the second wiring line 2040a can be formed on the second wiring line 2040a. In this instance, a plurality of semiconductor light emitting devices disposed along one direction is disposed on the plurality of through portions 2044, respectively.

Referring to FIGS. 14 and 15, the second wiring line 2040a may include a plurality of layers 2045, 2046, 2047. The plurality of layers 2045, 2046, 2047 can be formed of metal materials, respectively, and sequentially deposited. For more specific example, the second wiring line 2040a may include a first layer 2045, a second layer 2046 and a third layer 2047.

The first layer 2045 can be formed to overlap with the second conductive electrode 2152 of the semiconductor light emitting device to be in contact with the second conductive electrode 2152. Furthermore, the first layer 2045 may contain Ti or Cr, and can be formed by their deposition.

The second layer 2046 is deposited on the first layer 2045 based on a direction from a rear surface of the display device to a front surface thereof, and formed to transfer a scan signal or data signal to the second conductive electrode 2152. Accordingly, the second layer 2046 may contain Cu having a high conductivity to have a conductivity higher than that of the first layer 2045. Furthermore, the second layer 2046 can be formed to have a larger thickness than that of the first layer 2045 and third layer 2047 to reduce the resistance thereof The third layer 2047 is deposed on the second layer, and formed of a material having a reflectivity higher than that of the second layer. For example, the third layer 2047 may include Ti, Al or Ag, and the third layer 2047 becomes a portion of reflecting light toward the front surface of the display device in the periphery of the semiconductor light emitting device.

According to the foregoing wiring line of the present disclosure, light can be reflected in the periphery of the semiconductor light emitting device to enhance luminance. In particular, according to such a structure, it is possible to re-reflect light reflected on the lower portion from light excited through the phosphor.

Further, according to the foregoing display device, light emitted from the semiconductor light emitting devices is excited using phosphors to implement red (R) and green (G). As a result, the present disclosure presents a structure of phosphor layer capable of further increasing a filling space of phosphor or a new type of partition wall structure having flexibility different from the related art.

Figure 17:
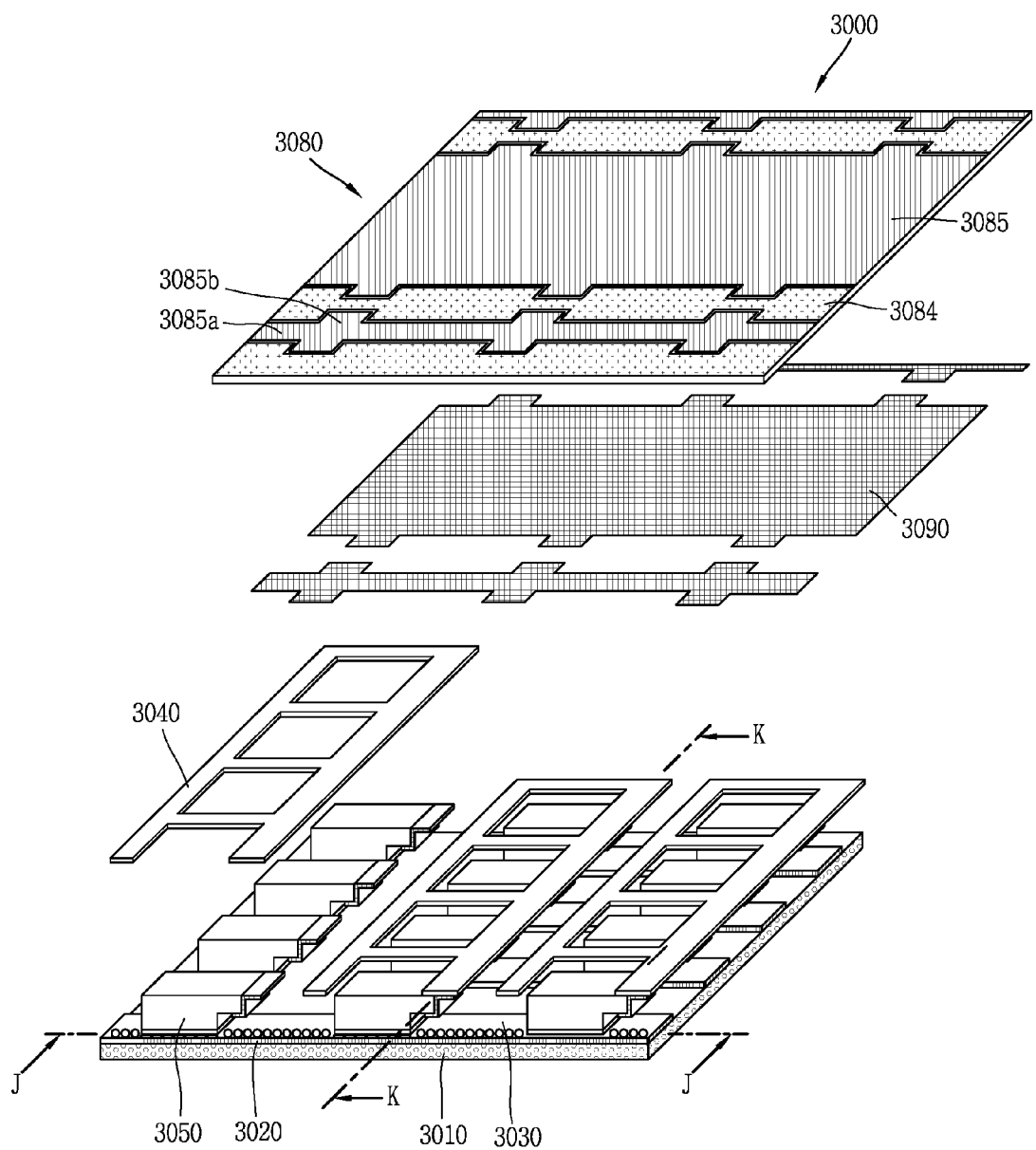
FIG. 17 is an enlarged view of a portion "A" of FIG. 1 illustrating another embodiment of the present disclosure.
Figure 18:
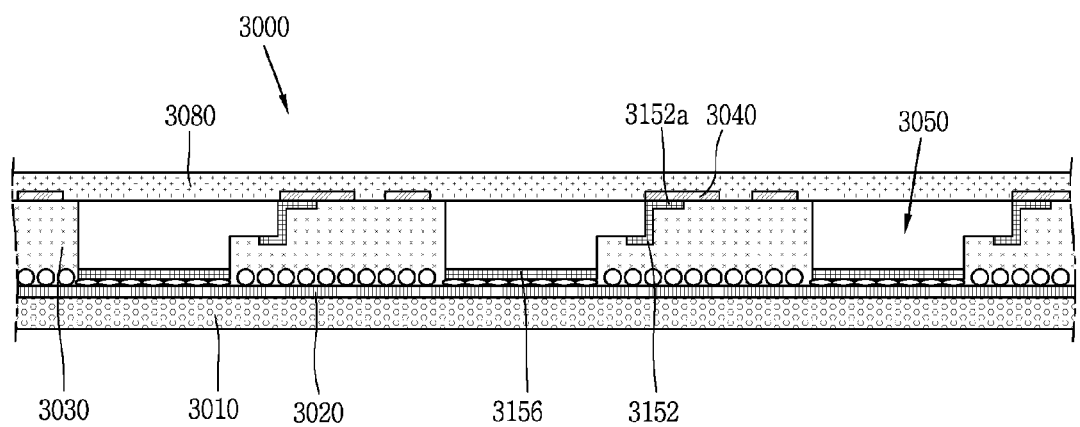
FIG. 18 is a cross-sectional view taken along line J-J in FIG. 17.
Figure 19:
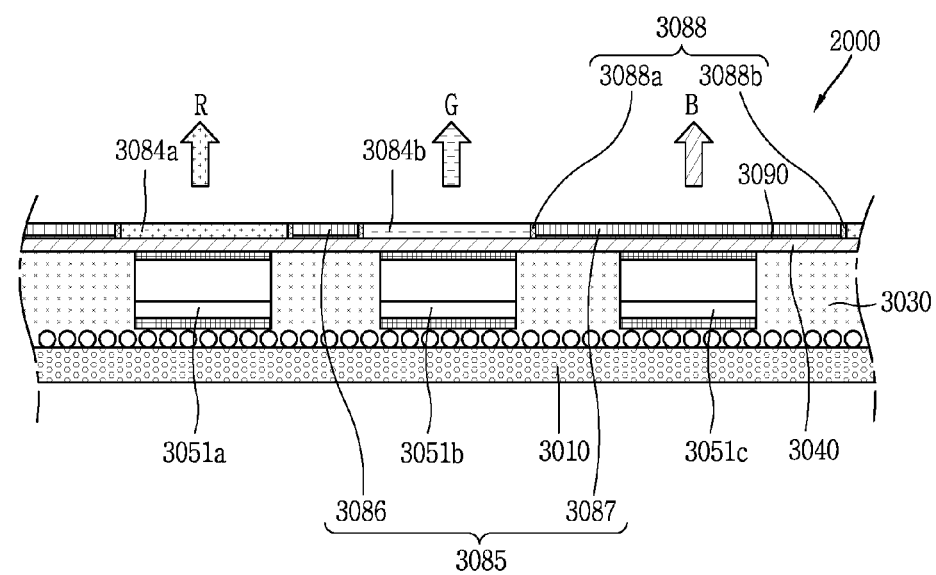
FIG. 19 is a cross-sectional view taken along line K-K in FIG. 17.
Figure 20A:
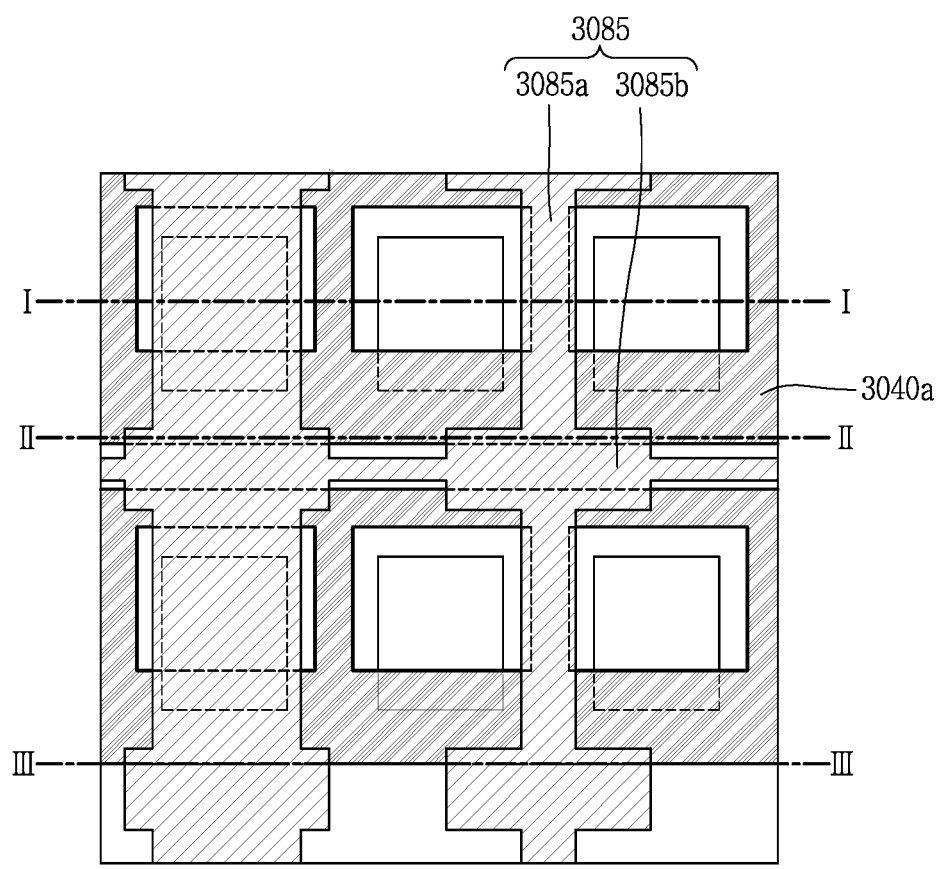
FIG. 20A is a plan view of FIG. 17.

Hereinafter, the structure of a display device according to the present disclosure will be described in more detail with reference to the accompanying drawings. In particular, FIG. 17 is an enlarged view of a portion "A" of FIG. 1 illustrating another embodiment of the present disclosure, FIG. 18 is a cross-sectional view taken along line J-J in FIG. 17, FIG. 19 is a cross-sectional view taken along line K-K in FIG. 17, FIG. 20A is a plan view of FIG. 17, and FIGS. 20B, 20C and 20D are cross-sectional views taken along lines I-I, II-II and III-III, respectively, in FIG. 17.

FIGS. 17, 18, 19 and 20A illustrates a display device 3000 using a flip type semiconductor light emitting device described with reference to FIGS. 13 through 16 will be described as a display device using a semiconductor light emitting device. More specifically, a novel structure of phosphor layer is applied to a display device described with reference to FIGS. 13 through 16 will be described. However, the example described below may be also applicable to a display device using the foregoing different type of semiconductor light emitting device.

As shown, the display device 3000 includes a substrate 3010, a first electrode 3020, a conductive adhesive layer 3030, a second electrode 3040 and a plurality of semiconductor light emitting devices 3050, and the description thereof will substituted by the description with reference to FIGS. FIGS. 10 through 12 or 13 through 16.

As described above, the display device 3000 may include a phosphor layer 3080 disposed to cover a plurality of semiconductor light emitting devices 3050. For example, the semiconductor light emitting device 3050 is a blue semiconductor light emitting device for emitting blue (B) light, and the phosphor layer 3080 performs a function of converting the blue (B) light to the color of a sub-pixel. In this instance, the foregoing second wiring line surrounds the light-emitting surface of the semiconductor light emitting device to reflect light reflected from the phosphor layer 3080 toward the front surface.

According to the drawing, the phosphor layer 3080 may include a plurality of phosphor portions 3084 for converting the wavelength of light and a plurality of partition wall portions 3085 formed between the plurality of phosphor portions 3084. The plurality of phosphor portions 3084 may include a red phosphor portion 3084a having a red phosphor and a green phosphor portion 3084b having a green phosphor.

At a position forming a red pixel, the red phosphor portion 3084a capable of converting blue light into red (R) light may be deposited on a blue semiconductor light emitting device 3051a. At a position forming a green pixel, the green phosphor portion 3084b capable of converting blue light into green (G) light may be deposited on a blue semiconductor light emitting device 3051b.

Further, one partition wall portion 3085 is disposed between the red phosphor portion 3084a and the green phosphor portion 3084b. In this instance, at least one of the plurality of partition wall portions 3085 overlaps with at least one of the plurality of semiconductor light emitting devices along a thickness direction of the phosphor layer 3080. Furthermore, at least one of the plurality of partition wall portions 3085 is formed to transmit light along a thickness direction of the phosphor layer 3080. More specifically, one partition wall portion 3085 is disposed on a blue semiconductor light emitting device 3051c at a portion constituting a blue pixel to transmit light emitted from the blue semiconductor light emitting device 3051c to an outside without color conversion.

In this instance, a phosphor portion or partition wall portion can be formed along each line of the first wiring line 3020a. Accordingly, one line on the first wiring line 3020a may be an electrode controlling one color. Furthermore, red (R), green (G) and blue (B) may be sequentially disposed along the second wiring line 3040a, thereby implementing a sub-pixel. However, the present disclosure is not limited to this, and quantum dot (QD) instead of phosphor may be filled in the phosphor portion to implement a sub-pixel emitting red (R), green (G) and blue (B).

In a more specific example, the plurality of partition wall portions 3085 may include a first partition wall portion 3086 and a second partition wall portion 3087. The first partition wall portion 3086 is disposed to cover between the plurality of semiconductor light emitting devices. Accordingly, at least part of the plurality of phosphor portions 3084 is disposed by interposing the first partition wall portion 3086 therebetween. In this instance, the at least part of the plurality of phosphor portions 3084 may include at least one of red phosphor, green phosphor and yellow phosphor. More specifically, the first partition wall portion 3086 is located at a portion where blue pixels are not disposed among spaces repeatedly formed between the red phosphor portion 3084a and the green phosphor portion 3084b. Accordingly, a semiconductor light emitting device is not disposed at a lower portion of the first partition wall portion 3086.

Further, the second partition wall portion 3087 is configured to cover at least one of the plurality of semiconductor light emitting devices. In this instance, at least one of the plurality of semiconductor light emitting devices covered by the second partition wall portion 3087 may include a blue semiconductor light emitting device 3051c. In other words, the second partition wall portion 3087 is located at a portion where blue pixels are disposed among spaces repeatedly formed between the red phosphor portion 3084a and the green phosphor portion 3084b. Accordingly, the blue semiconductor light emitting device 3051c is disposed at a lower portion of the second partition wall portion 3087.

In order to implement the foregoing structure, the first partition wall portion 3086 and the second partition wall portion 3087 can be disposed one by one within a sub-pixel emitting red (R), green (G) and blue (B), respectively. Furthermore, the first partition wall portion 3086 and the second partition wall portion 3087 can be formed to have different sizes of width formed along a direction perpendicular to a thickness direction of the phosphor layer 3080. In this instance, the first partition wall portion 3086 is formed to have the size of width smaller than that of the second partition wall portion 3087. The width of the second partition wall portion 3087 is configured to be larger than or equal to that of the plurality of semiconductor light emitting devices 3050, and thus the width of the first partition wall portion 3086 can be formed to be smaller than that of the plurality of semiconductor light emitting devices 3050.

For example, the width of the second partition wall portion 3087 may be configured to be larger than the size of the isolated blue semiconductor light emitting device 3051c by 1 or 2 micrometers. In a more specific example, when the width of the semiconductor light emitting device is 20 to 22 micrometers, and the pitch thereof is 28 to 30 micrometers, the width of the second partition wall portion 2087 may be 20 to 40 micrometers.

Furthermore, in this instance, the width of the first partition wall portion 3086 may be a size of 10 to 40 percent of a pitch between pixels. For example, when the pitch is 30 micrometers, the width of the first partition wall portion 3086 can be formed with 5 to 7 micrometers.

According to the drawing, the width of the phosphor portion 3084 may be configured to be larger than that of the light emitting device 3050. In addition to this, only two partition wall portions exist within a sub-pixel, and the width of one (for example, first partition wall portion) of the two becomes smaller, and thus the width of the phosphor portion 3084 further increases.

Further, the second partition wall portion 3087 is formed to be broken for each pixel. Thus, in case of a connected space, light can be guided to prevent or mitigate light from being interfered with other pixels. More specifically describing the structure of the partition wall portions 3085, at least one of the plurality of partition wall portions 3085 may include one or more metal thin films 3088 formed at an edge thereof, and a light transmitting material 3089 can be formed to fill between the metal thin films 3088.

As a material having a high transmittance in a visible light region, an epoxy-based photoresist (PR), polydimethylsiloxane (PDMS), resin or the like may be used for the light transmitting material 3089, for example. The materials are suitable for the material of the partition wall portion applied to a flexible display since they do not have hardening properties at high temperatures.

For example, the metal thin films 3088 are configured to cover a lateral surface of the plurality of phosphor portion 3084 to reflect light. The metal thin films 3088 may include a first metal thin film 3088a disposed at one edge of the partition wall portions 3085 and a second metal thin film 3088b disposed at the other edge thereof. The metal thin films 3088 may not exist at an upper and lower end of the partition wall portion. In other words, the first metal thin film 3088a and 3088b are configured to be separated from each other along a width direction of the partition wall portion. Thus structure, light passing through a light transmitting material may be emitted to the outside from an upper end of the partition wall portion.

The first metal thin film 3088a and second metal thin film 3088b are formed of a metal material such as aluminum, silver or the like having a high reflectivity in a visible light region to reflect light, thereby preventing color mixture between phosphor portions. However, the present disclosure is not limited to this, and for example, the metal thin film may be replaced with an oxide thin film such as TiOx, CrOx or the like, or a distributed Bragg reflector (DBR) structure may be applicable thereto.

Further, as illustrated in the drawing, an antireflection layer 3090 can be formed at a lower portion of at least one of the first partition wall portion 3086 and second partition wall portion 3087. The antireflection layer 3090 as a layer coated with a back anti-reflection material may include an adhesive organic material.

More specifically, the antireflection layer 3090 can be disposed at a lower portion of the light transmitting material of the partition wall portions. In this instance, the antireflection layer 3090 is formed to have the same width as that of each partition wall. Furthermore, the antireflection layer 3090 performs the role of an adhesive layer as well as the role of preventing the reflection of light.

Specifically, for a conductive adhesive layer, it is difficult to implement a fine pitch due to severe lower reflection during the patterning of partition walls, but such a problem may be solved by the antireflection layer. Furthermore, the antireflection layer 3090 may solve a problem of reducing adhesiveness to the partition wall portions according to a surface condition of the conductive adhesive layer.

Figure 20B:
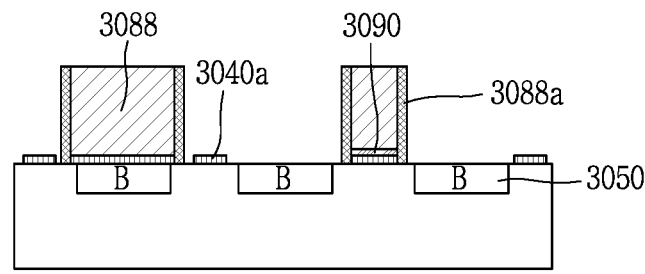
FIGS. 20B, 20C and 20D are cross-sectional views taken along lines I-I, II-II and III-III, respectively, in FIG. 17.
Figure 20C:
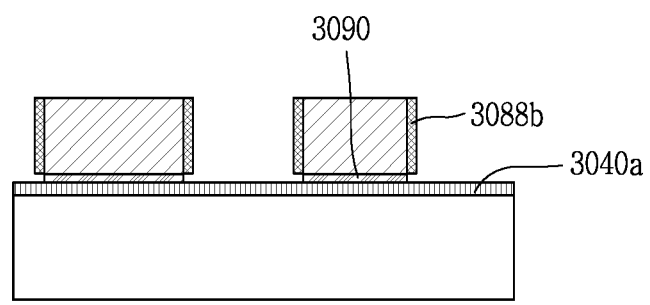
Figure 20D:
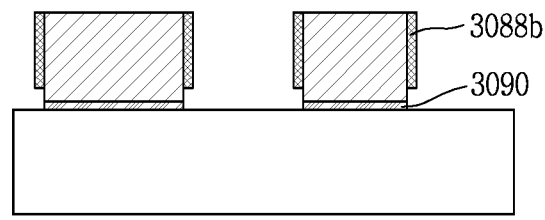

Further, referring to FIG. 20A, the plurality of partition wall portions 3085 are formed with a partially protruded shape on a plane. Due to such a shape, the deposition level of the metal thin films 3088 can be controlled. More specifically, as illustrated in FIGS. 20B through 20D, a lower portion of the partition wall portions 3085 is hidden in a deposition direction, and thus a portion at which the metal thin film 3088 is not disposed occurs at a lower portion of the partition wall portions 3085. Thus, it is possible to prevent a leakage path due to a short between the second electrode 3040 and the metal thin film 3088 from being occurred.

More specifically, at least one of the plurality of partition wall portions 3085 may include a base portion 3085a and a protrusion portion 3085b. The metal thin film 3088 can be disposed at an edge of the plurality of partition wall portions 3085, and thus the metal thin film 3088 may include a base portion 3088a and a protrusion portion 3088b similarly to the partition wall portions 3085.

The base portion 3085a is extended along a first direction, and the protrusion portion 3085b is protruded in a second direction perpendicular to the first direction from an end portion of the base portion 3085a. The first direction is a direction of extending one phosphor portion formed with the same color, and the second direction may be a direction of sequentially disposing red (R), green (G) and blue (B) pixels.

Due to the protrusion portion 3085b, a metal thin film (or base portion with a metal thin film) 3088a formed on the base portion 3085a and a metal thin film (or protrusion portion with a metal thin film) 3088b formed on the 3085b can be formed to have different lengths along a thickness direction of the phosphor layer 3080. More specifically, a distance to the substrate from the metal thin film (or protrusion portion with a metal thin film) 3088b formed on the 3085b can be configured to be larger than that from the metal thin film (or base portion with a metal thin film) 3088a formed on the base portion 3085a.

In this instance, the protrusion portion is disposed to overlap with at least part of a wiring electrode of the semiconductor light emitting device in a thickness direction of the phosphor layer 3080. For example, the second direction can be a direction in parallel to the second electrode 3040 disposed at an upper portion based on the conductive adhesive layer 3030. Due to such a structure, a separation distance between the second electrode 3040 and the metal thin film (or protrusion portion with a metal thin film) 3088b formed on the protrusion portion can be sufficiently secured.

According to the foregoing new structure of a phosphor layer, it is possible to implement a partition wall portion suitable to a display having a flexible characteristic. Hereinafter, a method of fabricating the foregoing new structure of a phosphor layer will be described in more detail with reference to the accompanying drawings. In particular, FIGS. 21A to 22F are cross-sectional views illustrating a fabrication method of a display device using a semiconductor light emitting device according to the present disclosure.

Figure 21A:
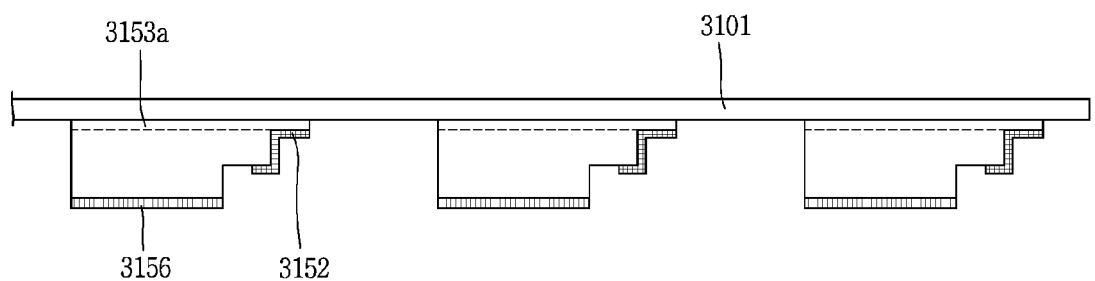
FIGS. 21A, 21B, 21C, 22A, 22B, 22C, 22D, 22E and 22F are cross-sectional views illustrating a fabrication method of a display device using a semiconductor light emitting device according to the present disclosure.
Figure 21B:
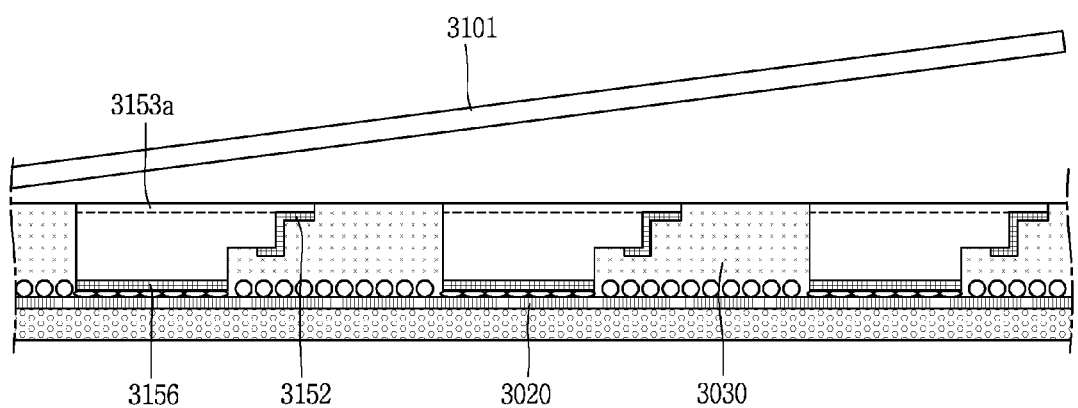
Figure 21C:
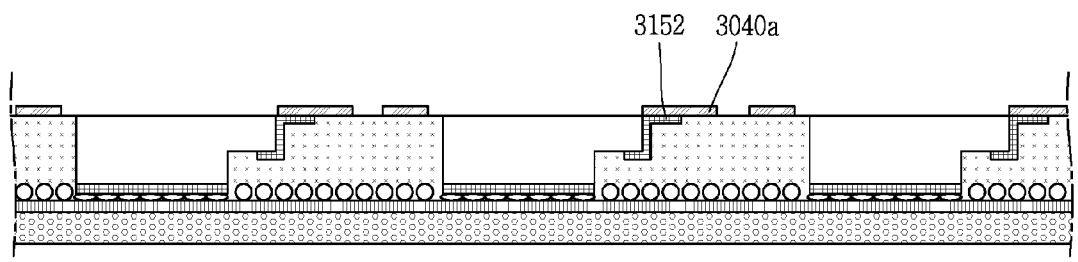

FIGS. 21A to 21C are views illustrating a fabrication method of a display device using a semiconductor light emitting device according to the present disclosure with reference to cross-sectional views seen in a direction of J-J in FIGS. 17 to 22E are views illustrating a fabrication method of a display device using a semiconductor light emitting device according to the present disclosure with reference to cross-sectional views seen in a direction of K-K in FIG. 17.

First, according to the fabrication method, the process of coupling a plurality of semiconductor light emitting devices to a substrate is performed. For example, For example, a first conductive semiconductor layer, an active layer and a second conductive semiconductor layer are grown on a growth substrate, and each semiconductor light emitting device is created through etching, and then a first conductive electrode 3156 and a second conductive electrode 3152 are formed (FIG. 21A).

The growth substrate 3101 (wafer) can be formed of a material having light transmitting properties such as any one of sapphire ($Al_2O_3$), GaN, ZnO and AlO, but is not limited to this. Furthermore, the growth substrate 3101 can be formed of a material suitable to semiconductor material growth, carrier wafer. The growth substrate 3101 can be formed of a material having a high thermal conductivity, and use a SiC substrate having a thermal conductivity higher than that of the sapphire substrate ($Al_2O_3$) or at least one of Si, GaAs, GaP, InP and $Ga_2O_3$ including a conductive substrate or insulating substrate.

The first conductive electrode 3156 and first conductive semiconductor layer may be a p-type electrode and a p-type semiconductor layer, respectively, and the second conductive electrode 3152 and second conductive semiconductor layer may be an n-type electrode and an n-type semiconductor layer, respectively. However, the present disclosure is not limited to this, and includes the first conductive type is an n-type and the second conductive type is a p-type.

In this instance, as described above, at least part of the second conductive electrode 3152 is protruded from a lateral surface of the second conductive semiconductor layer (or a lateral surface of the undoped semiconductor layer 2153*a*).

Next, the flip chip type semiconductor light emitting device is coupled to a wiring substrate suing the conductive adhesive layer 3030, and the growth substrate is removed (FIG. 21B). The wiring substrate is in a state that the first electrode 3020 is formed thereon, and the first electrode 3020, as a lower wiring layer, is electrically connected to the first conductive electrode 3156 by a conductive ball or the like within the conductive adhesive layer 3030.

Then, the undoped semiconductor layer 3153*a* is etched and removed, and then the second electrode 3040 connected to the protruded second conductive electrode 3152 is formed (FIG. 21C). As an upper wiring layer, the wiring line may be a second wiring line 3040*a* directly connected to the second conductive electrode 3152.

In this instance, the wiring line can be formed to surround the light-emitting surface of the plurality of semiconductor light emitting devices to retro-reflect light reflected from a phosphor layer in the periphery of the plurality of semiconductor light emitting devices. The structure of the wiring line will be substituted by the description of the foregoing second wiring line described with reference to FIGS. 13 through 20D.

Furthermore, as described above, the wiring line can be formed with a plurality of layers. For the purpose of this, the forming the wiring line may include depositing a first layer configured to overlap with the conductive electrode to be in contact with the conductive electrode, depositing a second layer deposited on the first layer with a thickness larger than that of the first layer, and depositing a third layer formed of a material with a reflectivity higher than that of the second layer on the second layer.

Next, a phosphor layer disposed to cover the plurality of semiconductor light emitting devices is formed. The phosphor layer may include a plurality of phosphor portions for converting the wavelength of light and a plurality of partition wall portions formed between the plurality of phosphor portions. In this instance, at least one of the plurality of partition wall portions may overlap with at least one of the plurality of semiconductor light emitting devices along a thickness direction of the phosphor layer.

Figure 22A:
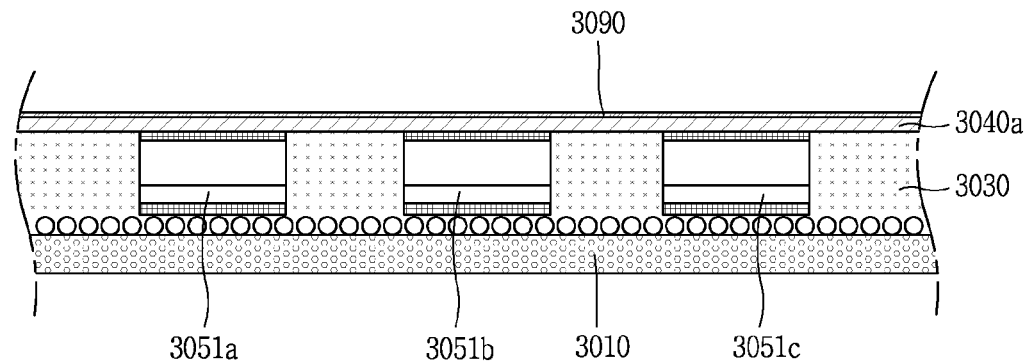
Figure 22B:
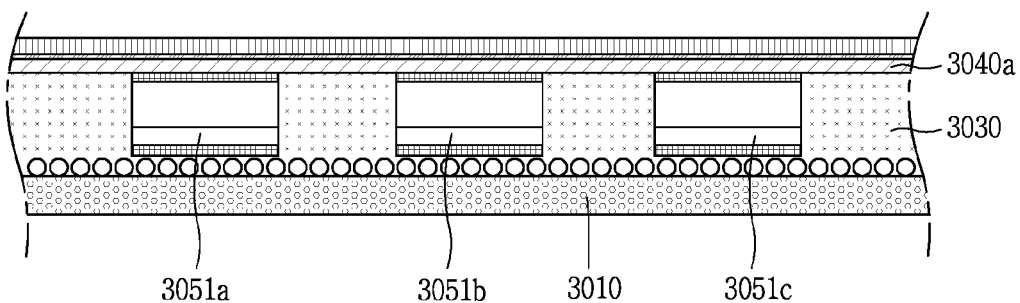

According to the drawing, first, the process of forming a reflection reduction layer may be performed. Referring to FIG. 22A, the antireflection layer 3090 is coated on the plurality of semiconductor light emitting devices. Next, the process of forming a partition wall portion is performed. Referring to FIG. 22B, the light transmitting material (RT) is coated on the plurality of semiconductor light emitting device.

As a material having a high transmittance in a visible light region, as described above, an epoxy-based photoresist (PR), polydimethylsiloxane (PDMS), resin or the like may be used for the light transmitting material (RT). Then, the process of etching the light transmitting material (RT) and the antireflection layer 3090, and filling a phosphor into a portion (LR) from which the light transmitting material (RT) and the antireflection layer 3090 are etched to create the phosphor portions is performed.

Figure 22C:
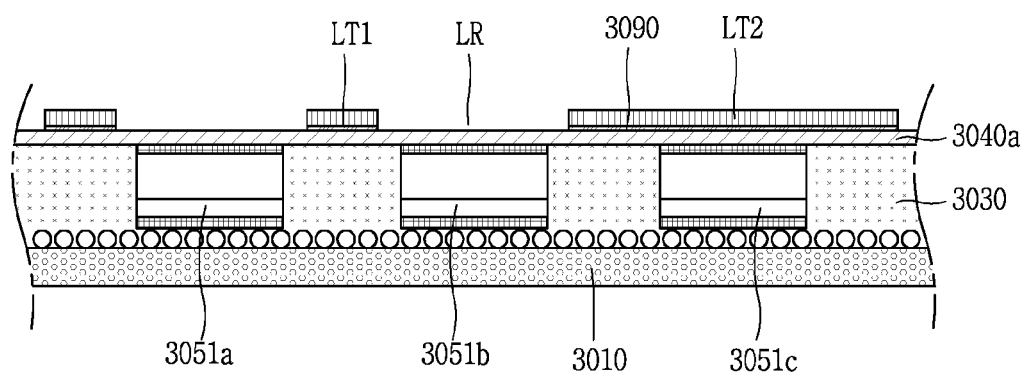

More specifically, referring to FIG. 22C, the light transmitting material (RT) is etched, and in this instance, the light transmitting material (RT) is non-etched on a portion corresponding to at least one of the plurality of semiconductor light emitting devices. In other words, due to the etching, the light transmitting material (RT) may be partitioned into a portion (LT1) disposed to cover between the plurality of semiconductor light emitting devices and a portion (LT2) disposed to cover at least one of the plurality of semiconductor light emitting devices.

In this instance, the plurality of partition wall portions may be etched in a shape including base portions and protrusion portions. For example, the etched light transmitting material may include a protrusion portion protruded from an end portion of the base portion to hide at least part of the light transmitting material along a deposition direction of the metal thin film.

Figure 22D:
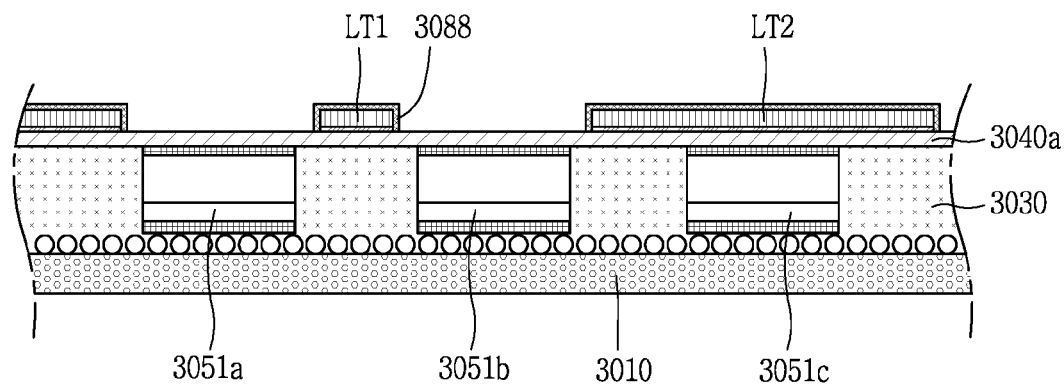

Referring to FIG. 22D, the process of etching the light transmitting material, and then etching the metal thin film 3088 on the light transmitting material (RT) is performed. In this instance, the metal thin films 3088 may be deposited on an entire outer surface of the light transmitting material (RT) using a deposition technology or sputter. The metal thin film can be formed of a metal material such as such as aluminum, silver or the like having a high reflectivity in a visible light region as described above.

Figure 22E:
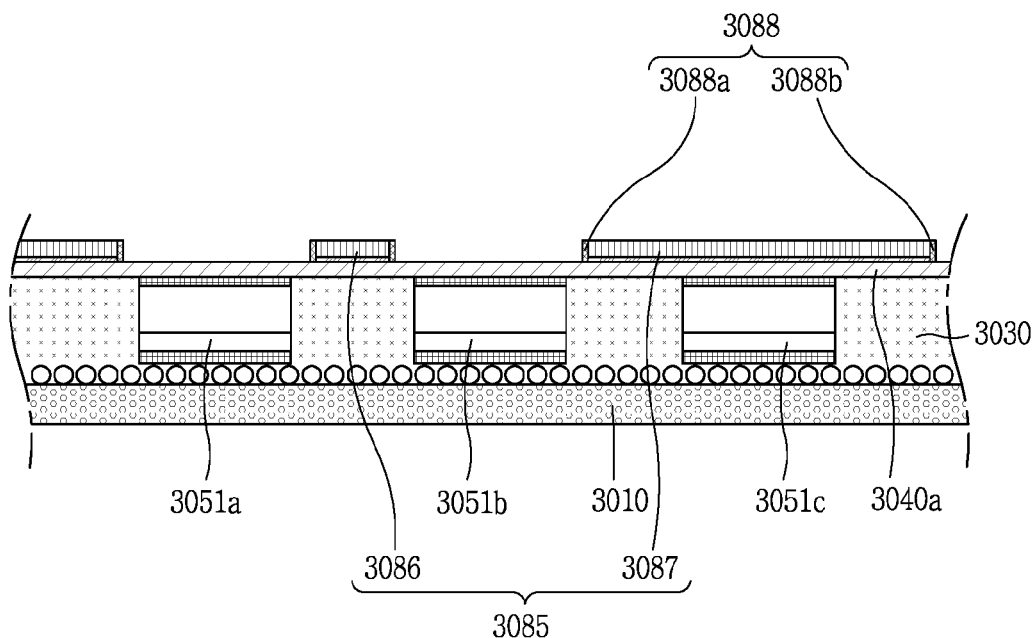

Then, at least part of the metal thin film is removed to transmit light emitted from the semiconductor light emitting device to a portion corresponding to at least one of the plurality of semiconductor light emitting devices (refer to FIG. 22E). For example, a metal thin film may be removed from an upper surface (a surface which is the farthest from the semiconductor light emitting device) of the partition wall portion, and in this case an upper portion of the metal thin film may be removed by dry etching to minimize an effect on the semiconductor light emitting device.

Figure 22F:
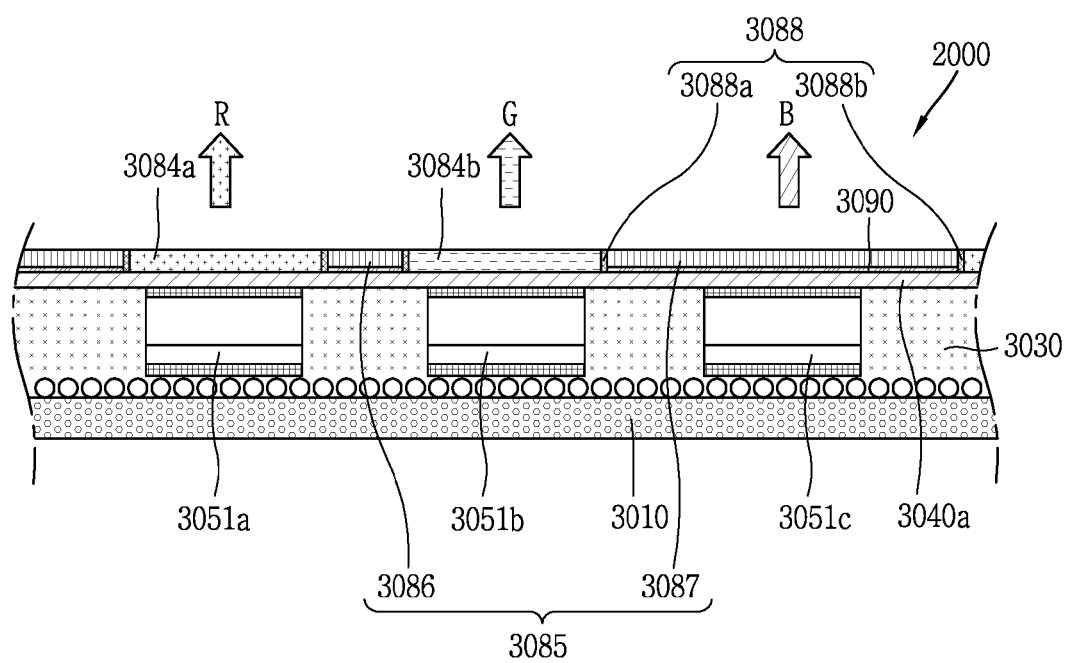

Next, as illustrated in FIG. 22F, a phosphor is filled between the light transmitting materials deposited with the metal thin films to create the phosphor portion. For an example of creating the phosphor portion, first, a method of coating and developing a photoresist and then sequentially coating a red phosphor and a green phosphor may be used. In another example, a method of filling a yellow phosphor between the light transmitting materials deposited with the metal thin films, and then adhering a color filter repeated with red, green and blue thereto may be used. In this instance, the phosphor portion may be combined with the color filter to implement red, green and blue sub-pixels.

The present invention encompasses various modifications to each of the examples and embodiments discussed herein.

According to the invention, one or more features described above in one embodiment or example can be equally applied to another embodiment or example described above. The features of one or more embodiments or examples described above can be combined into each of the embodiments or examples described above. Any full or partial combination of one or more embodiment or examples of the invention is also part of the invention.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A display device, comprising:
   a plurality of semiconductor light emitting devices, each corresponding semiconductor light emitting device having a first conductive electrode, a first conductive semiconductor layer formed on the first conductive electrode, an active layer formed on the first conductive semiconductor layer, a second conductive semiconductor layer formed on the active layer, a second conductive electrode formed on the second conductive semiconductor layer, and a light-emitting surface configured to emit light;
   a first wiring line electrically connected to the first conductive electrode; and
   a second wiring line disposed to cross the first conductive electrode, and be electrically connected to the second conductive electrode,
   wherein the second wiring line is formed to surround a periphery of the light-emitting surface of the semiconductor light emitting devices to reflect light emitted by the light emitting devices toward a front surface of the display device,
   wherein the second wiring line comprises:
      a line portion extended along one line, contacted with the second conductive electrode, and electrically connected to the second conductive electrode;
      a plurality of protrusion portions protruded in a direction perpendicular to the one direction on the line portion; and
      a parallel portion connected to the protrusion portions and being parallel to the line portion, and
      wherein the parallel portion is physically separated from the second conductive electrode,
   wherein the second conductive electrode further includes a protrusion portion extending from one surface of the second conductive semiconductor layer to a lateral surface thereof, and extending to an upper surface of the second conductive semiconductor layer, and
   wherein an upper surface of the protrusion portion of the second conductive electrode is planar with the upper surface of the second conductive semiconductor layer.

2. The display device of claim 1, wherein the second wiring line includes a plurality of through portions sequentially arranged along one direction corresponding to locations of the semiconductor light emitting devices.

3. The display device of claim 2, wherein the semiconductor light emitting devices are disposed along the one direction on the through portions.

4. The display device of claim 1, wherein the semiconductor light emitting devices are disposed between the line portion and the parallel portion, and between the protrusion portions.

5. The display device of claim 1, wherein a width of the parallel portion is smaller than that of the line portion.

6. The display device of claim 1, wherein the second wiring line includes a plurality of layers formed of metal materials.

7. The display device of claim 6, wherein the plurality of layers comprise:
   a first layer overlapping with the second conductive electrode and in contact with the second conductive electrode;
   a second layer deposited on the first layer to transfer a scan signal or data signal to the first conductive electrode; and
   a third layer deposited on the second layer and including a material with a reflectivity higher than that of the second layer.

8. The display device of claim 7, wherein the first layer contains Ti or Cr, the second layer contains Cu, and the third layer contains Ti, Al or Ag.

9. The display device of claim 7, wherein a thickness of the second layer is larger than that of the first and the third layer.

10. The display device of claim 1, further comprising:
    a phosphor layer disposed to cover the semiconductor light emitting devices,
    wherein the second wiring line surrounds the light-emitting surface of the semiconductor light emitting devices to reflect light reflected from the phosphor layer toward the front surface.

11. The display device of claim 10, wherein the phosphor layer comprises a plurality of phosphor portions configured to convert a wavelength of light, and a plurality of partition wall portions formed between the phosphor portions, and
    wherein at least one of the partition wall portions overlaps with at least one of the semiconductor light emitting devices along a thickness direction of the phosphor layer.

12. The display device of claim 11, wherein at least one of the partition wall portions comprises one or more metal thin films formed at an edge thereof, and a light transmitting material filled between the metal thin films.

13. The display device of claim 11, wherein the partition wall portions comprise:
    a first partition wall portion disposed to cover between the semiconductor light emitting devices, and a second partition wall portion configured to cover at least one of the semiconductor light emitting devices.

14. The display device of claim 13, further comprising:
    an antireflection layer at a lower portion of at least one of the first and the second partition wall portions.

15. The display device of claim 13, wherein the first and the second partition wall portions have different sizes of width formed along a direction perpendicular to a thickness direction of the phosphor layer.

* * * * *